United States Patent
Noda et al.

(10) Patent No.: US 8,716,147 B2
(45) Date of Patent: May 6, 2014

(54) MANUFACTURING METHOD OF SEMICONDUCTOR DEVICE AND SUBSTRATE PROCESSING APPARATUS

(75) Inventors: Takaaki Noda, Toyama (JP); Masami Miyamoto, Tokyo (JP); Ryuji Yamamoto, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/273,028

(22) Filed: Nov. 18, 2008

(65) Prior Publication Data

US 2009/0130829 A1  May 21, 2009

(30) Foreign Application Priority Data

Nov. 19, 2007 (JP) ................................. 2007-299104
May 27, 2008 (JP) ................................. 2008-138091

(51) Int. Cl.
  *H01L 21/31* (2006.01)
(52) U.S. Cl.
  USPC .................................. 438/758; 257/E21.002
(58) Field of Classification Search
  USPC .................................. 257/E21.002; 438/758
  See application file for complete search history.

(56) References Cited

U.S. PATENT DOCUMENTS

| 5,015,330 | A |   | 5/1991 | Okumura et al. | |
| 5,164,012 | A | * | 11/1992 | Hattori | 118/725 |
| 7,556,839 | B2 |   | 7/2009 | Noda et al. | |
| 2003/0224615 | A1 | * | 12/2003 | Nishino et al. | 438/758 |
| 2009/0117752 | A1 | * | 5/2009 | Ozaki et al. | 438/795 |

FOREIGN PATENT DOCUMENTS

| JP | 03224222 |   | 10/1991 | |
| JP | 095950 | * | 3/2004 | C23C 16/455 |
| JP | 2005039153 |   | 2/2005 | |
| JP | WO/2006/049225 | * | 5/2006 | H01L 21/205 |
| JP | WO 2006/049225 | * | 5/2006 | H01L 21/205 |
| KR | 20070040846 |   | 4/2007 | |
| WO | 2005093799 |   | 10/2005 | |

* cited by examiner

*Primary Examiner* — Zandra Smith
*Assistant Examiner* — Jamie C Niesz
(74) *Attorney, Agent, or Firm* — Brundidge & Stanger, P.C.

(57) ABSTRACT

Provided are a manufacturing method of a semiconductor device and a substrate processing apparatus. The manufacturing method of the semiconductor device includes: loading a plurality of substrates into a reaction vessel, which is configured by a process tube and a manifold that supports the process tube, and arranging the loaded substrates within the reaction vessel; pre-processing the plurality of substrates by supplying a pre-process gas from the manifold side toward the process tube side within the reaction vessel; main-processing the plurality of pre-processed substrates by supplying a main-process gas from the manifold side toward the process tube side within the reaction vessel; and unloading the plurality of main-processed substrates from the reaction vessel, wherein in pre-processing the plurality of substrates, the pre-process gas is supplied from at least one position in an area corresponding to the manifold, and at least one position in an upper area of an area corresponding to a substrate arrangement area.

11 Claims, 11 Drawing Sheets

MANUFACTURING METHOD OF SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2007-299104, filed on Nov. 19, 2007, in the Japanese Patent Office, the entire contents of which are hereby incorporated by reference.

BACKGROUND OF THE INVENTION

1. Field of the Invention

The present invention relates to a manufacturing method of a semiconductor device and a substrate processing apparatus.

More particularly, the present invention relates to a method for forming a high-quality interface between a wafer and a thin film in a process for forming a thin film on a semiconductor wafer (hereinafter, referred to as a wafer) in a fabrication method of an integrated circuit (hereinafter, referred to as IC) including a semiconductor device, and a substrate processing apparatus for realizing the forming method.

2. Description of the Prior Art

In the IC fabrication method, a thin film is formed on a wafer by a low pressure chemical vapor deposition (LP-CVD) method.

In recent years, when a wafer is introduced into a reactor, the following method has been used for solving problems such as semiconductor degradation caused by increase of a natural oxide film or impurity attachment.

A preparatory chamber is installed at a front stage of the reactor. After oxygen or moisture is sufficiently removed from the preparatory chamber and the inside of the preparatory chamber is replaced with a nitrogen gas, a wafer is introduced into the reactor.

The LP-CVD method is performed by using a vertical-type LP-CVD apparatus (hereinafter, referred to as a CVD apparatus having a preparatory chamber) which is installed in a vacuum-exhaustible sealing mechanism at a front stage of the reactor.

In the CVD apparatus having the preparatory chamber, an unprocessed wafer is loaded from a wafer transfer opening into the preparatory chamber and then set in a boat, a wafer processing jig. Thereafter, the preparatory chamber is airtightly closed, and oxygen or moisture is removed by repeating the vacuum exhaust and the nitrogen purge. Then, the wafer is loaded from the preparatory chamber into the reactor by the boat.

However, in the CVD apparatus having the preparatory chamber, a wafer surface may be contaminated during the vacuum exhaust by contaminants such as organic materials, because a driving shaft or a boat rotating mechanism and a pipeline for loading the wafer and the boat into the reactor are installed inside the preparatory chamber.

Therefore, a hydrogen ($H_2$) annealing method has been used for removing a natural oxide film or impurity from the wafer by using a reaction gas within the reactor where the wafer is loaded. For example, see Patent Document 1.

[Patent Document 1] Japanese Patent Publication No. H5-29309

However, since the hydrogen annealing method generally requires a high temperature process of 900-1000° C., there will arise a problem that increases a thermal damage and a thermal budget of IC.

Herein, when forming a high-quality interface between a wafer and a thin film at a low oxygen and carbon dose, it is important to suppress contamination of the surface of the wafer, which is introduced into the CVD apparatus having the preparatory chamber, to the minimum until a film is formed in the reactor.

Specifically, it is necessary to seek a cleaning method of a wafer surface as follows.

During the nitrogen replacement before the loading of the wafer into the reactor and during the unloading of the wafer from the reactor, the preparatory chamber suppresses the contamination of the wafer surface with organic materials from the driving shaft, the boat rotating mechanism and the wirings.

The inside of the reactor suppresses the contamination from a relatively low-temperature furnace throat and a wafer itself.

The cleaning of the atmosphere inside the reactor, and the reduction and release of contaminants adsorbed on the wafer surface are performed before a thin film is formed on the wafer.

When the wafer surface is to be cleaned in batch, for example, in a mass-production process for processing 100-150 wafers, by using the CVD apparatus having the preparatory chamber, the contamination of the wafer surface may be generated unevenly in a wafer interfacial direction inside the reactor, that is, a wafer arrangement direction, due to degassing from the relatively low-temperature furnace throat or the wafer.

SUMMARY OF THE INVENTION

An object of the present invention is to provide a manufacturing method of a semiconductor device and a substrate processing apparatus, which are capable of forming a high-quality interface between a wafer and a thin film at a low oxygen and carbon dose over a wafer interfacial direction in a mass-production batch process.

According to an aspect of the present invention, there is provided a manufacturing method of a semiconductor device, comprising: loading a plurality of substrates into a reaction vessel, which is configured by a process tube and a manifold that supports the process tube, and arranging the loaded substrates within the reaction vessel; pre-processing the plurality of substrates by supplying a pre-process gas from the manifold side toward the process tube side within the reaction vessel; main-processing the plurality of pre-processed substrates by supplying a main-process gas from the manifold side toward the process tube side within the reaction vessel; and unloading the plurality of main-processed substrates from the reaction vessel, wherein in pre-processing the plurality of substrates, the pre-process gas is supplied from at least one position in an area corresponding to the manifold, and at least one position in an upper area of an area corresponding to a substrate arrangement area.

According to another aspect of the present invention, there is provided a manufacturing method of a semiconductor device, comprising: loading a plurality of substrates into a reaction vessel, and arranging the loaded substrates within the reaction vessel; pre-processing the plurality of substrates by supplying a pre-process gas into the reaction vessel; main-processing the plurality of pre-processed substrates by supplying a main-process gas into the reaction vessel; and unloading the plurality of main-processed substrates from the reaction vessel, wherein in pre-processing the plurality of substrates, the pre-process gas is supplied from at least one position in an area which is at a lower temperature than temperature in a substrate arrangement area, and at least one position in a downstream end area of an area corresponding to the substrate arrangement area.

According to another aspect of the present invention, there is provided a manufacturing method of a semiconductor device, comprising: loading a plurality of substrates into a reaction vessel, and arranging the loaded substrates within the reaction vessel; pre-processing the plurality of substrates by supplying a pre-process gas into the reaction vessel; main-processing the plurality of pre-processed substrates by supplying a main-process gas into the reaction vessel; and unloading the plurality of main-processed substrates from the reaction vessel, wherein in pre-processing the plurality of substrates, the pre-process gas is supplied from at least one position in an area which is lower than a substrate arrangement area, and at least one position in an upper area of an area corresponding to the substrate arrangement area.

According to another aspect of the present invention, there is provided a manufacturing method of a semiconductor device, comprising: loading a substrate into a reaction vessel; pre-processing the substrate inside the reaction vessel; main-processing the pre-processed substrate inside the reaction vessel; and unloading the main-processed substrate from the reaction vessel, wherein in pre-processing the substrate, the pre-process gas is supplied from a plurality of positions inside the reaction vessel, and flow rates, concentrations or kinds of the pre-process gas are different in at least one position of the plurality of positions and the other positions.

According to another aspect of the present invention, there is provided a manufacturing method of a semiconductor device, comprising: loading a substrate into a reaction vessel; pre-processing the substrate inside the reaction vessel; main-processing the pre-processed substrate inside the reaction vessel; and unloading the main-processed substrate from the reaction vessel, wherein in pre-processing the substrate, a plurality of kinds of the pre-process gas are supplied from a plurality of positions inside the reaction vessel, and flow rate ratios or concentration ratios of the plurality of kinds of the pre-process gas are different in at least one position of the plurality of positions and the other positions.

According to another aspect of the present invention, there is provided a substrate processing apparatus, comprising: a process tube for processing a plurality of substrates; a manifold for supporting the process tube; a support member for arranging and supporting the plurality of substrates inside the process tube; a first nozzle for supplying a gas from at least one position in an area corresponding to the manifold; a second nozzle for supplying a gas from at least one position of an upper area of an area corresponding to a substrate arrangement area inside the process tube; an exhaust passage, installed at an opposite side to a side where the first nozzle is installed in the process tube, for exhausting the inside of the process tube; and a controller for executing a control so as to pre-process the plurality of substrates by supplying a pre-process gas from the first nozzle and the second nozzle toward the exhaust passage, and main-process the plurality of pre-processed substrates by supplying a main-process gas from at least the first nozzle toward the exhaust passage.

According to another aspect of the present invention, there is provided a substrate processing apparatus, comprising: a process tube for processing a plurality of substrates; a manifold for supporting the process tube; a support member for arranging and supporting the plurality of substrates inside the process tube; a first nozzle for supplying a gas from at least one position in an area corresponding to the manifold; a second nozzle for supplying a gas from a plurality of positions including at least an upper area of an area corresponding to a substrate arrangement area inside the process tube; an exhaust passage, installed at an opposite side to a side where the first nozzle is installed in the process tube, for exhausting the inside of the process tube; and a controller for executing a control so as to pre-process the plurality of substrates by supplying a pre-process gas from the first nozzle and the second nozzle toward the exhaust passage, and main-process the plurality of pre-processed substrates by supplying a main-process gas from at least the first nozzle toward the exhaust passage.

BRIEF DESCRIPTION OF THE DRAWINGS

FIG. 5A shows the evaluation when a first evaluation apparatus is used, and FIG. 5B shows the evaluation when a second evaluation apparatus is used.

DETAILED DESCRIPTION OF THE PREFERRED EMBODIMENTS

Hereinafter, an embodiment of the present invention will be described with reference to the attached drawings.

In the current embodiment, a manufacturing method of a semiconductor device relevant to the present invention is performed by using a CVD apparatus having a preparatory chamber shown in FIG. 1 and FIG. 2 (hereinafter, referred to as a CVD apparatus) as a substrate processing apparatus.

In the current embodiment, before forming a thin film, one or mixture of a hydrogen containing gas, a silicon containing gas and a chlorine containing gas as a pre-process gas (interface cleaning gas) is introduced from a 2-system or multi-system gas line into a reactor, or introduced with a carrier gas from a 2-system or multi-system gas line into a reactor.

First, a CVD apparatus will be described.

Figure 1:
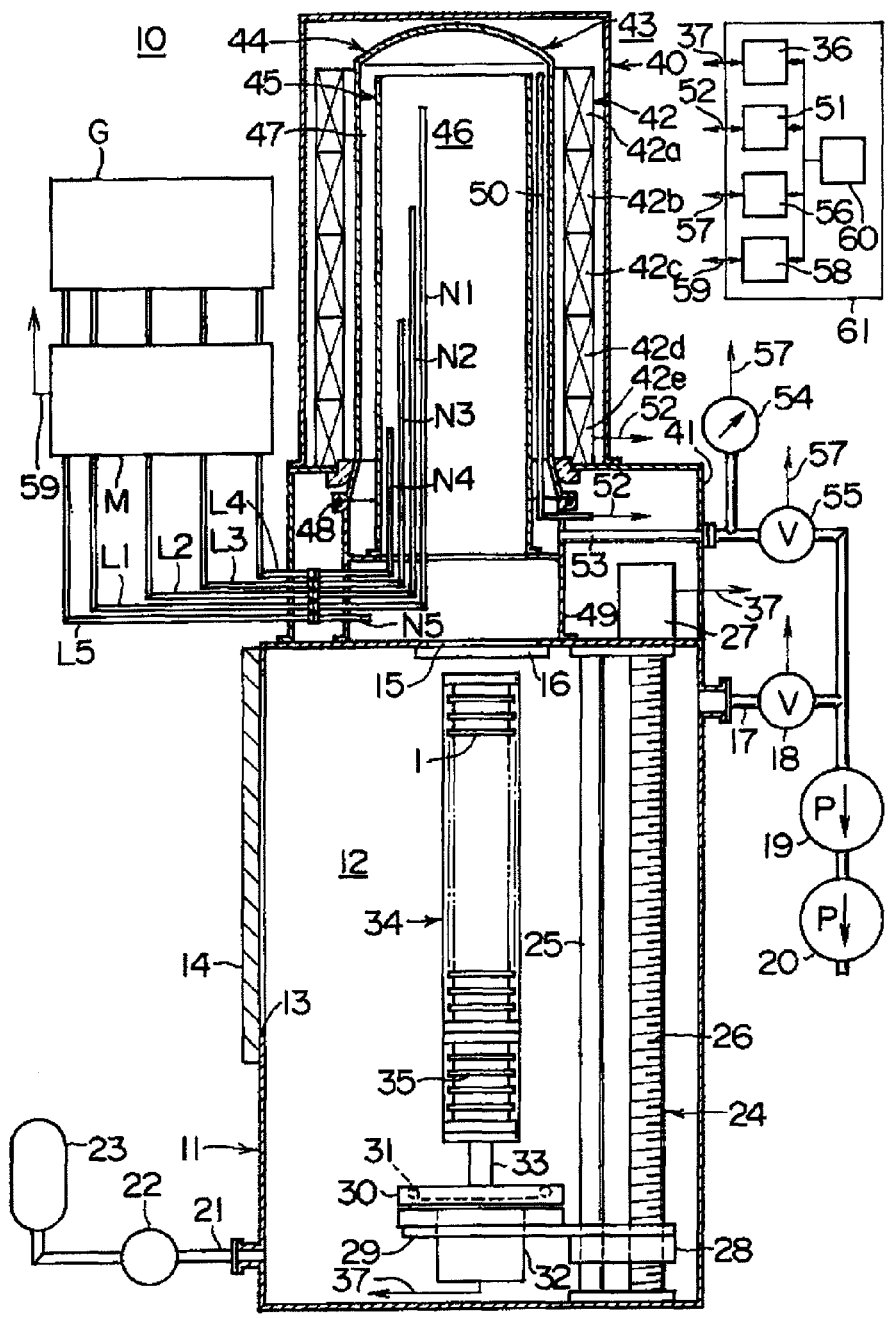
FIG. 1 is a side sectional view schematically showing a CVD apparatus in accordance with a first embodiment of the present invention.

As shown in FIG. 1, a CVD apparatus 10 is provided with a housing 11, and a preparatory chamber 12 is installed at the housing 11. The preparatory chamber 12 is installed as a sealing chamber having a sealing mechanism, which can maintain pressure below an atmospheric pressure, and constitutes a preparatory chamber which is installed at a front stage of the reactor.

At a front wall of the housing 11, a wafer carrying-in and carrying-out opening 13 is installed so that it is opened and closed by a gate value 14.

At a ceiling wall of the housing 11, a boat loading and unloading opening 15 through which a boat 34 is loaded and unloaded is installed so that it is opened and closed by a shutter 16.

At the housing 11, one end of an exhaust line 17 for exhausting an atmosphere inside the preparatory chamber 12 is connected, and the other end of the exhaust line 17 is connected via a valve 18 to a mechanical booster pump 19 and a dry pump 20 as a vacuum pump.

At the housing 11, one end of a nitrogen gas supply line 21 for supplying a nitrogen gas as a purge gas into the preparatory chamber 12 is connected, and the other end of the nitrogen gas supply line 21 is connected via a mass flow controller 22 to a nitrogen gas supply source 23.

Inside the preparatory chamber 12 of the housing 11, a boat elevator 24 is installed to move the boat 34 upward and downward. By moving the boat 34 upward and downward, the boat elevator 24 loads the boat 34 into a processing chamber 46, which will be described later, or unloads the boat 34 from the processing chamber 46.

The boat elevator 24 includes a guide rail 25 and a transfer screw shaft 26, which are installed vertically, and a motor 27 for rotating the transfer screw shaft 26 forward or backward. At the guide rail 25, an elevating body 28 is fitted so that it is moving upward and downward, and the elevating body 28 is screwed to the transfer screw shaft 26 so that it is moving upward and downward.

At the elevating body 28, an arm 29 protrudes horizontally and, on the top surface of the front end of the arm 29, a seal cap 30 is horizontally installed as a furnace throat lid capable of air-tightly closing the boat loading and unloading opening 15 installed at the ceiling wall of the housing 11. The seal cap 30 is in contact with a lower surface of the ceiling wall of the housing 11 vertically. The seal cap 30 is made of a metal such as a stainless steel and is formed in a disk shape. On the top surface of the seal cap 30, an O-ring 31 as a seal member is installed to contact the lower surface of the ceiling wall of the housing 11.

At the lower part of the seal cap 30, a rotating mechanism 32 is installed to rotate the boat, and a rotating shaft 33 of the rotating mechanism 32 passes through the seal cap 30 and is connected to the boat 34. The rotating mechanism 32 rotates the boat 34 so that the wafer 1 is rotated.

The boat 34 as a substrate support member is made of a heat-resistant material such as quartz or silicon carbide, and is configured to support a plurality of wafers 1 as substrates at a horizontal position, with their centers aligned, along multiple stages.

At the lower part of the boat 34, a plurality of heat insulation plates 35 are arranged at a horizontal position along multiple stages. The heat insulation plates 35 are made of a heat-resistant material such as quartz or silicon carbide, and are formed in a disk shape. While the boat 34 is accommodated inside the processing chamber 46, the heat insulation plates 35 make it difficult to transfer heat from a heater 42 toward the preparatory chamber 12.

At the rotating mechanism 32 and the motor 27 of the boat elevator 24, a driving control unit 36 is electrically connected by an electrical wiring 37. The driving control unit 36 controls the rotating mechanism 32 and the motor 27 of the boat elevator 24 so that they can perform a desired operation at a desired timing.

On the housing 11 in conjugation with the boat loading and unloading opening 15, a reactor 40 is installed.

The reactor 40 includes a heater 42 as a heating mechanism. The heater 42 is formed in a cylindrical shape and is supported on a heater base 41 serving as a holding plate, so that the heater 42 is installed vertically. The heater 42 is divided into five zones: an upper (U) zone 42a, a center-up (CU) zone 42b, a center (C) zone 42c, a center-lower (CL) zone 42d, and a lower (L) zone 42e.

At the inside of the heater 42, a process tube 43 as a reaction tube is installed concentrically with the heater 42. The process tube 43 includes an outer tube 44 as an outer reaction tube, and an inner tube 45 as an inner reaction tube which is installed inside the outer tube 44.

The outer tube 44 is made of a heat-resistant material such as quartz ($SiO_2$) or silicon carbide (SiC). An inner diameter of the outer tube 44 is greater than an outer diameter of the inner tube 45, and the outer tube 44 is formed in a cylindrical shape with an upper part closed and a lower part opened. The outer tube 44 is installed concentrically with the inner tube 45.

The inner tube 45 is made of a heat-resistant material, for example, quartz or silicon carbide, and is formed in a cylindrical shape with its upper and lower parts opened. A cylindrical hollow part of the inner tube 45 forms a processing chamber 46, and the processing chamber 46 accommodates a plurality of wafers 1 which are arranged at a horizontal position in a vertical direction along multiple stages by the boat 34.

A gap between the outer tube 44 and the inner tube 45 forms a cylindrical space 47 as an exhaust passage.

At the lower part of the outer tube 44, an O-ring 48 as a seal member is installed, and a manifold 49 is installed concentrically with the outer tube 44. The manifold 49 is made of a material such as a stainless steel and is formed in a cylindrical shape with its upper and lower parts opened.

The manifold 49 connects and supports the outer tube 44 and the inner tube 45. The manifold 49 is supported on the heater base 41 or the ceiling wall of the housing 11, so that the process tube 43 is installed vertically.

A reaction vessel is configured by the process tube 43 and the manifold 49.

At the inside of the process tube 43, a temperature sensor 50 as a temperature detector is installed. At the heater 42 and the temperature sensor 50, a temperature control unit 51 is electrically connected by an electrical wiring 52. The temperature control unit 51 controls the heater 42 so that temperature inside the processing chamber 46 is made to have a desired temperature distribution at a desired timing, by adjusting an electrified state of the heater 42, based on temperature information detected by the temperature sensor 50.

At the manifold 49, an exhaust pipe 53 for exhausting an atmosphere inside the processing chamber 46 is installed. The exhaust pipe 53 is installed at a lower part of the cylindrical space 47 formed by the gap between the outer tube 44 and the inner tube 45, and communicates with the cylindrical space 47.

At the downstream part which is opposite to the part connected to the manifold 49 of the exhaust pipe 53, a pressure sensor 54 as a pressure detector and a pressure adjustment device 55 are installed, and an exhaust device such as a mechanical booster pump (MBP) 19 and a dry pump (DP) 20 is connected. The pressure sensor 54, the pressure adjustment device 55, the mechanical booster pump 19, and the dry pump 20 exhaust the processing chamber 46 in order that the pressure inside the processing chamber 46 has a predetermined level (vacuum degree).

At the pressure sensor 54 and the pressure adjustment device 55, a pressure control unit 56 is electrically connected by an electrical wiring 57. The pressure control unit 56 controls the pressure adjustment device 55 at a desired timing to make the pressure inside the processing chamber 46 to a desired level, based on a pressure detected by the pressure sensor 54.

At the manifold 49, a plurality of nozzles as gas inlets are connected to communicate with the processing chamber 46.

The nozzles include four long nozzles with an elbow tube shape (L-shape) having different lengths respectively, and a short nozzle with a straight tube shape (I-shape).

The first long nozzle N1, the second long nozzle N2, the third long nozzle N3 and the fourth long nozzle N4 are installed between the boat 34 and the inner tube 45 and extend up to an area facing the heater 42 in a wafer group array area.

Gas outlets of the first long nozzle N1, the second long nozzle N2, the third long nozzle N3 and the fourth long nozzle N4 are respectively positioned at different heights in the area corresponding to the wafer group array area, and all the gas outlets are opened upward in an array direction (vertical direction) of the wafer group.

A gas outlet of a short nozzle N5 which is a fifth nozzle is positioned at an area facing the manifold 49 which is upper than the wafer group array area, that is, an area which is lower than the wafer group array area and is at a lower temperature than the wafer group array area, and the gas outlet of the short nozzle N5 is opened in a perpendicular direction (horizontal direction) with respect to the array direction of the wafer group.

Figure 2:
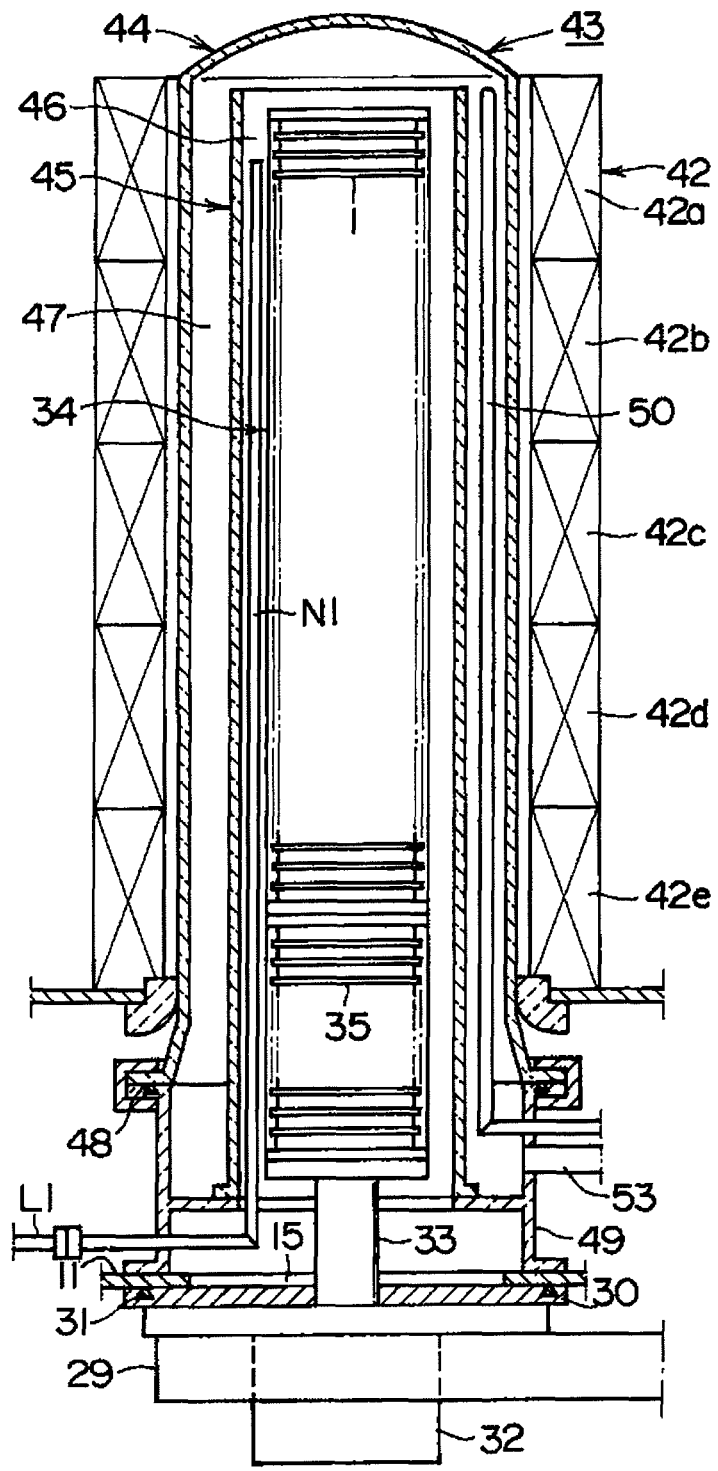
FIG. 2 is a side sectional view showing main parts of the CVD apparatus of FIG. 1.

In FIG. 2, for convenience, only the first long nozzle N1 as the first nozzle is shown, and the other nozzles are omitted.

Gas supply lines L1 to L5 are respectively connected to the nozzles N1 to N5. At the sides opposite to the connection sides of the nozzles N1 to N5 and the gas supply lines L1 to L5, a gas supply and flow rate controller M including a plurality of valves and a plurality of gas flow rate controllers (mass flow controllers) is installed and connected to a gas supply unit G including a plurality of gas supply sources.

At the gas supply and flow rate controller M, a gas supply and flow rate control unit 58 is electrically connected by an electrical wiring 59. The gas supply and flow rate control unit 58 controls the gas supply and flow rate controller M at a desired timing so that gas flow rates of gases flowing through the gas supply lines L1 to L5 are set to desired flow rates.

Figure 10A:
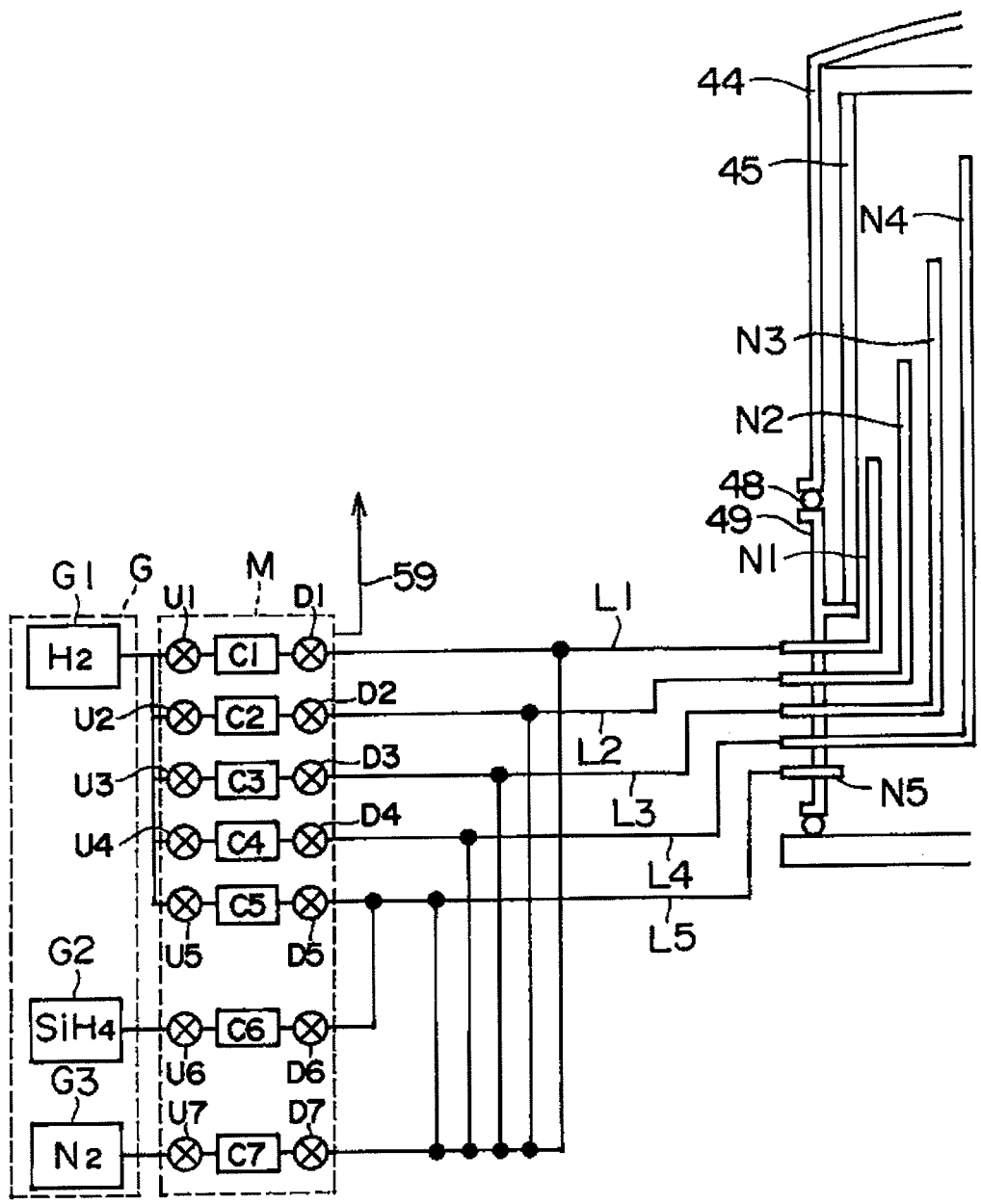
FIG. 10A is a pipe arrangement diagram showing an example of a first supply system.
Figure 10B:
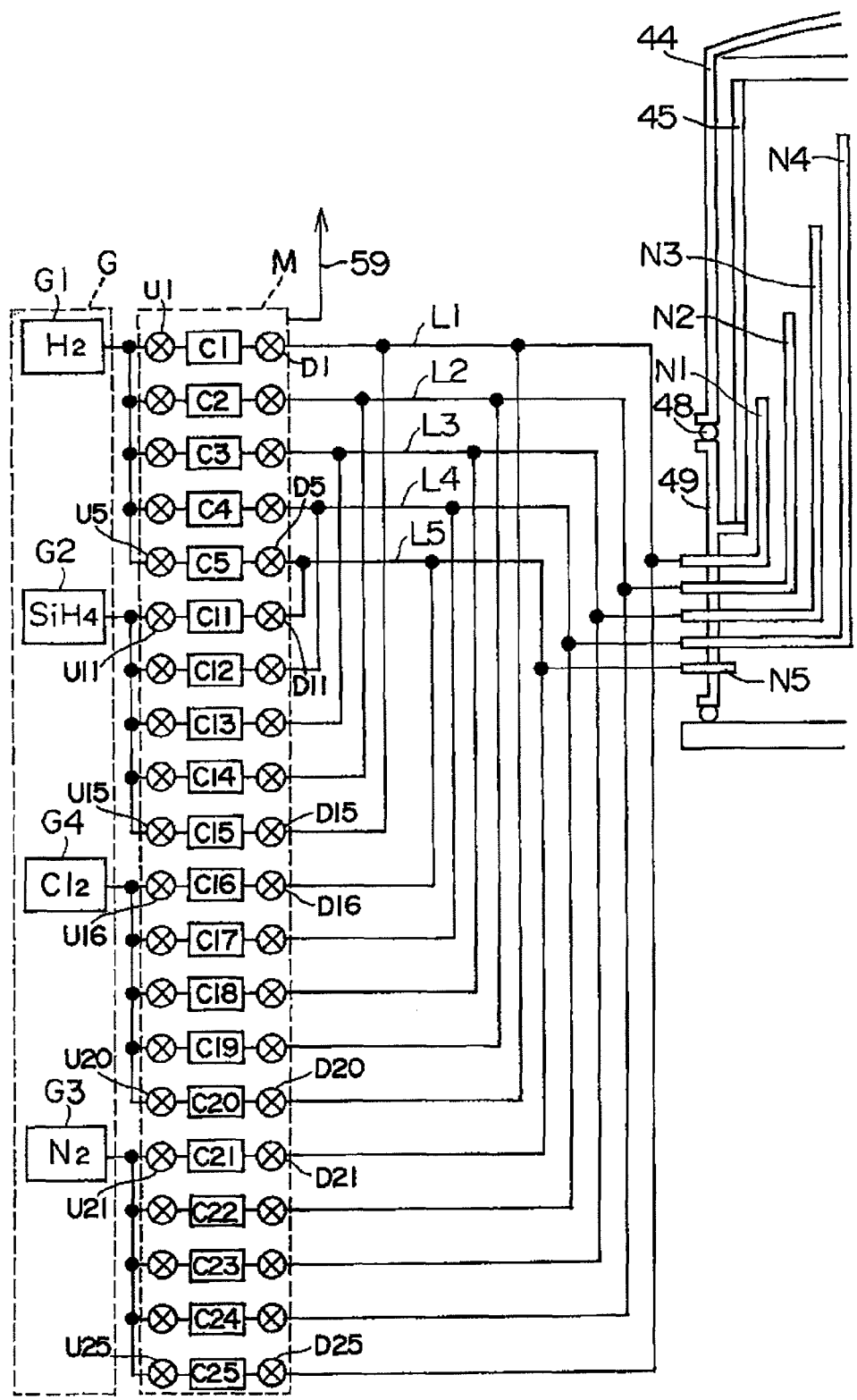
FIG. 10B is a pipe arrangement diagram showing an example of a second supply system.

FIG. 10A and FIG. 10B show specific examples of the gas supply system.

FIG. 10A illustrates an example (hereinafter, referred to as an example of a first supply system) used when a first pre-process sequence is performed as described later.

In the example of the first supply system, the first gas supply source G1 supplies a hydrogen ($H_2$) gas to the gas supply lines L1 to L5. The second gas supply source G2 supplies a mono-silane ($SiH_4$) gas to the gas supply line L5. The third gas supply source G3 supplies a nitrogen ($N_2$) gas to the gas supply lines L1 to L5.

At the gas supply lines L1 to L5 for supplying the hydrogen gas from the first gas supply source G1, the upstream valves U1 to U5, the mass flow controllers C1 to C5, and the downstream valves D1 to D5 are installed sequentially from the upstream side.

At the connection line for supplying the mono-silane gas from the second gas supply source G2 to the gas supply line L5, the upstream valve U6, the mass flow controller C6, and the downstream valve D6 are installed sequentially from the upstream side.

At the connection line for supplying the nitrogen gas from the third gas supply source G3 to the gas supply lines L1 to L5, the upstream valve U7, the mass flow controller C7 and the downstream valve D7 are installed sequentially from the upstream side. The gas supply unit G includes the first gas supply source G1, the second gas supply source G2 and the third gas supply source G3, and the gas supply and flow rate controller M includes the upstream valves U1 to U7, the mass flow controllers C1 to C7 and the downstream valves D1 to D7.

That is, in the case where the hydrogen gas is used as the pre-process gas, the example of the first supply system can change the flow rate and concentration of the hydrogen gas at the respective gas supply lines L1 to L5, that is, the respective nozzles N1 to N5, by controlling the valves and the mass flow controllers of the gas supply and flow rate controller M.

FIG. 10B illustrates an example (hereinafter, referred to as an example of a second supply system)-used when a second pre-process sequence is performed as described later.

In the example of the second supply system, the first gas supply source G1 supplies a hydrogen ($H_2$) gas to the gas supply lines L1 to L5. The second gas supply source G2 supplies a mono-silane ($SiH_4$) gas to the gas supply lines L1 to L5. The fourth gas supply source G4 supplies a chlorine ($Cl_2$) gas to the gas supply lines L1 to L5. The third gas supply source G3 supplies a nitrogen ($N_2$) gas to the gas supply lines L1 to L5.

At the gas supply lines L1 to L5 for supplying the hydrogen gas from the first gas supply source G1, the upstream valves U1 to U5, the mass flow controllers C1 to C5, and the downstream valves D1 to D5 are installed sequentially from the upstream side.

At the connection line for supplying the mono-silane gas from the second gas supply source G2 to the gas supply lines L1 to L5, the upstream valves U11 to U15, the mass flow controllers C11 to C15, and the downstream valves D11 to D15 are installed sequentially from the upstream side.

At the connection line for supplying the chlorine gas from the fourth gas supply source G4 to the gas supply lines L1 to L5, the upstream valves U16 to U20, the mass flow controllers C16 to C20, and the downstream valves D16 to D20 are installed sequentially from the upstream side.

At the connection line for supplying the nitrogen gas from the third gas supply source G3 to the gas supply lines L1 to L5, the upstream valves U21 to U25, the mass flow controllers C21 to C25, and the downstream valves D21 to D25 are installed sequentially from the upstream side. The gas supply unit G includes the first gas supply source G1, the second gas supply source G2, the third gas supply source G3 and the fourth gas supply source G4, and the gas supply and flow rate controller M includes the upstream valves U1 to U5 and U11 to U25, the mass flow controllers C1 to C5 and C11 to C25, and the downstream valves D1 to D5 and D11 to D25.

That is, the example of the second supply system can change the flow rates and concentrations of the hydrogen gas, the mono-silane gas and the chlorine gas at the respective gas supply lines L1 to L5, that is, the respective nozzles N1 to N5, by controlling the valves and the mass flow controllers of the gas supply and flow rate controller M.

The driving control unit 36, the temperature control unit 51, the pressure control unit 56 and the gas supply and flow rate control unit 58 also constitute an operating unit and an input/output unit, and are electrically connected to a main control unit 60 for controlling the entire CVD apparatus 10.

The driving control unit 36, the temperature control unit 51, the pressure control unit 56, the gas supply and flow rate control unit 58 and the main control unit 60 constitute a controller 61.

Next, as one process of a manufacturing method of a semiconductor device relevant to one embodiment of the present invention, a method for forming a polycrystalline silicon layer or a single-crystalline silicon layer (hereinafter, refereed to as a silicon layer) on a wafer by using the above-described CVD apparatus 10 will be described with reference to FIG. 3 and FIG. 4.

Figure 3:
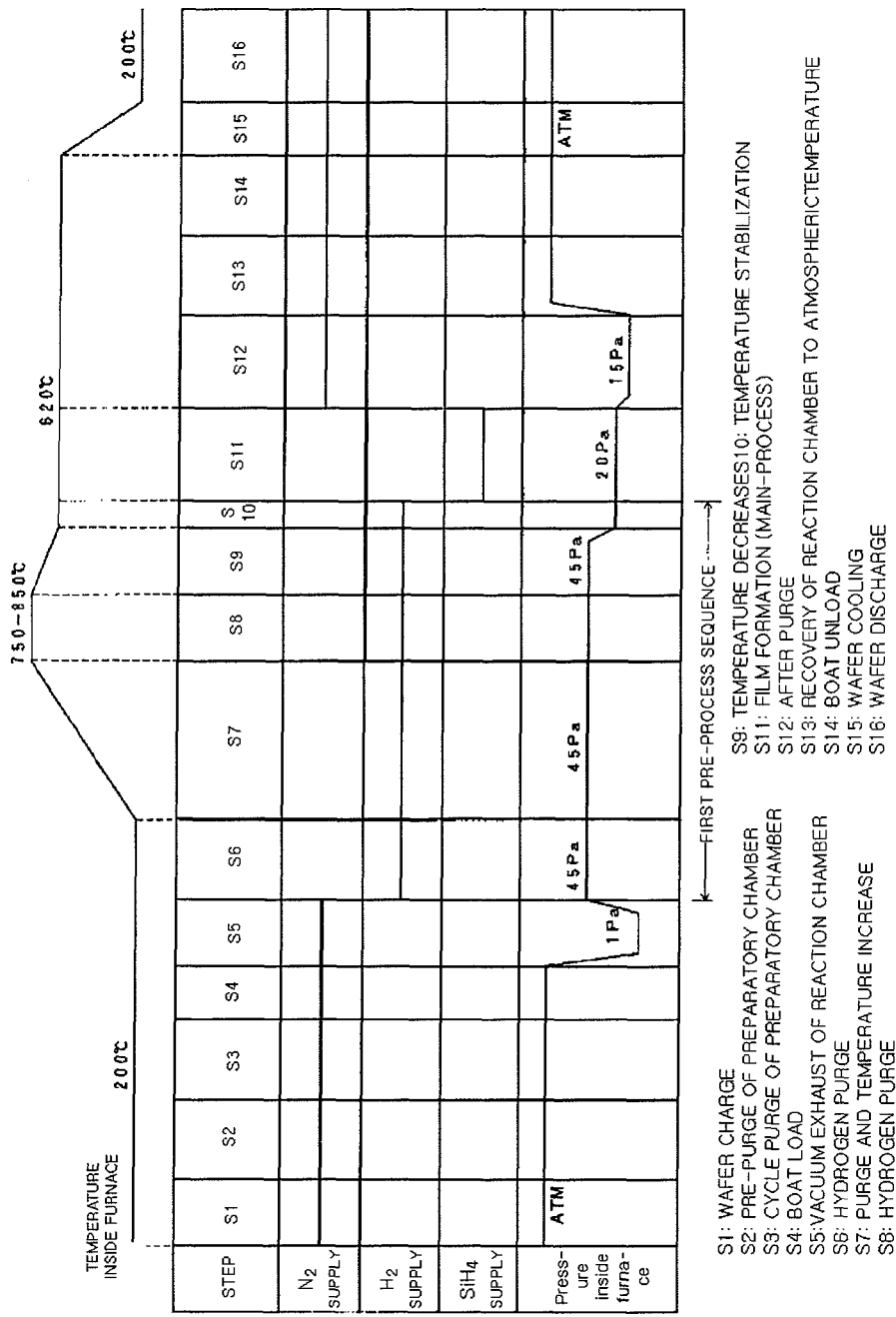
FIG. 3 is a sequence flowchart showing a process of forming a silicon layer in a manufacturing method of a semiconductor device, relevant to a first embodiment of the present invention.
Figure 4:
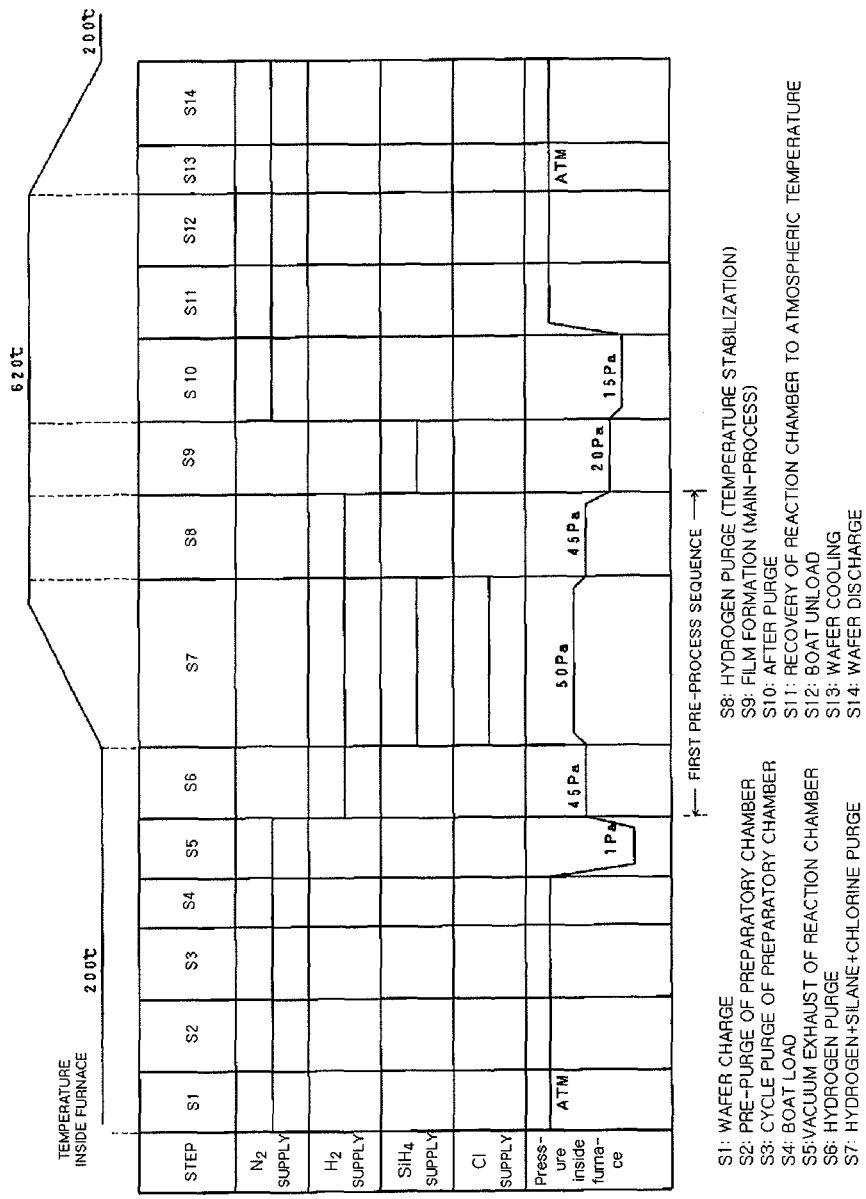
FIG. 4 is a sequence flowchart showing a process of forming a silicon layer in a manufacturing method of a semiconductor device, relevant to a second embodiment of the present invention.

FIG. 3 and FIG. 4 are sequence flowcharts showing a method for forming a silicon layer on a wafer, specifically showing a variation of temperature inside a furnace, respective step names, supply timings of a nitrogen ($N_2$) gas, a hydrogen ($H_2$) gas, a silane ($SiH_4$) gas and a chlorine ($Cl_2$) gas, and a variation of pressure inside the furnace.

In FIG. 3 and FIG. 4, a horizontal axis represents the elapse of time, and a vertical axis represents the temperature inside the furnace, the respective steps, the supply states of the respective gases, and the pressure inside the furnace.

FIG. 3 shows a method for forming a silicon layer, relevant to a first embodiment, and FIG. 4 shows a method for forming a silicon layer, relevant to a second embodiment.

In the following description, operations of the respective parts constituting the CVD apparatus 10 are controlled by the controller 61.

A natural oxide film on the surface of a silicon wafer is removed by using a diluted HF acid (diluted hydrofluoric acid) and simultaneously its surface is H-terminated, and then, 1-arrangement sheets of wafers 1, for example, 100-150 sheets of wafers, are charged into the boat 34 inside the preparatory chamber 12 (wafer charge step).

Thereafter, a purge by an inert gas inside the preparatory chamber 12, for example, a nitrogen purge, is performed (pre-purge step), and a vacuum exhaust and a nitrogen purge are repetitively performed inside the preparatory chamber 12 (cycle purge step). Due to these steps, oxygen and moisture are sufficiently removed from an internal atmosphere of the preparatory chamber 12.

Thereafter, the boat elevator 24 moves upward the boat 34 charged with the wafer group, and loads the boat 34 into the processing chamber 46 via the boat loading and unloading opening 15 (boat load step).

If the boat 34 holding the plurality of wafers 1 is completely loaded into the processing chamber 46, the seal cap 30 is brought into contact with the lower surface of the ceiling wall of the housing 11, which constitutes the boat loading and unloading opening 15, via the O-ring 31, and closes the boat loading and unloading opening 15, so that the inside of the processing chamber 46 is sealed.

In this case, in order to prevent oxidation of the wafer surface in the boat load step, the temperature control unit 51 controls the heater 42 so that temperature inside the reactor 40 (processing chamber 46) (hereinafter, referred to as "inside the furnace") is set to a wafer load temperature lower than a wafer process temperature, for example, about 100-400° C.

In the cases of FIG. 3 and FIG. 4, the wafer load temperature is adjusted to 200° C.

During an interval from the wafer charge step to the boat load step, pressure inside the furnace is maintained at an atmospheric pressure (ATM).

Thereafter, while the temperature inside the furnace is maintained at the wafer load temperature, the inside of the furnace is vacuum-exhausted by the mechanical booster pump 19 and the dry pump 20 (vacuum exhaust step).

In this case, the pressure control unit 56 controls the pressure adjustment device 55 so that the pressure inside the furnace is adjusted to a level lower than the atmospheric pressure and lower than the pressure during the processing of wafer, for example, about 1-10000 Pa.

In the cases of FIG. 3 and FIG. 4, the pressure inside the furnace is adjusted to 1 Pa.

In this case, the driving control unit 36 controls the rotating mechanism 32 to rotate the boat 34 at a predetermined rotating speed.

The above-described steps are the initial steps that are common to the sequence of the method for forming the silicon layer relevant to the first and second embodiments shown in FIG. 3 and FIG. 4.

The following description will be made on a sequence (hereinafter, referred to as a first pre-process sequence) for removing contaminants by using a hydrogen gas in the first embodiment shown in FIG. 3.

After the pressure inside the furnace is adjusted: to a predetermined level (in this case, 45 Pa), the inside of the furnace is exhausted while supplying a hydrogen gas into the furnace, and thus, the inside of the furnace is purged by the hydrogen gas (hydrogen purge step).

Thereafter, while the supply and exhaust of the hydrogen gas into/from the furnace are maintained, the temperature inside the furnace increases from the wafer load temperature to a first preprocess temperature, for example, about 750-850° C. (temperature increase step).

Before the temperature increase step, that is, from the hydrogen purge step, the supply of the hydrogen gas into the furnace is started.

The supply and exhaust of the hydrogen gas into/from the furnace are continuously performed until completing a temperature decrease step of decreasing the temperature inside the furnace from the first pre-process temperature (750-850° C.) to a film forming temperature (620° C.), which will be described later, and a temperature stabilization step of stabilizing the temperature inside the furnace to the film forming temperature.

The hydrogen gas is supplied from all the nozzles. N1 to N5 of FIG. 1 into the furnace. That is, the hydrogen gas is supplied from the short nozzle N5, whose gas outlet is positioned in the area corresponding to the manifold 49, and the long nozzles N1 to N4, whose gas outlets are positioned in the areas corresponding to the wafer group array area. The hydrogen gas supplied into the furnace rises up at the inside of the furnace, flows downward through the cylindrical space 47, and is exhausted from the exhaust pipe 53.

By maintaining the supply and exhaust of the hydrogen gas for a predetermined time, the process for removing the natural oxide film and the contaminants from the wafer is continued for a predetermined time. A reaction mechanism of the process for removing the natural oxide film and the contaminants, that is, a mechanism for removing oxygen (O), carbon (C) and the natural oxide film ($SiO_2$) by using hydrogen will be described below.

It is considered that the following reaction is performed when the hydrogen gas is supplied into the furnace.

In the following formula, a material denoted by * represents an activated species.

$$H_2 \rightarrow 2H^* \qquad 1)$$

$$2H^* + O \rightarrow H_2O\uparrow \qquad 2)$$

$$2H_2 + C \rightarrow CH_4\uparrow \qquad 3)$$

$$SiO_2 + 2H^* \rightarrow SiO\uparrow + H_2O\uparrow \qquad 4)$$

It is considered that at the temperature range of 750-850° C., $H_2$ can be separated into $H^*$ which is chemically activated [reaction formula 1]].

It is considered that they are evaporated in a form of $H_2O$ or $CH_4$ or SiO by reaction with oxygen or carbon remaining at the atmosphere inside the furnace and the natural oxide film, and are then exhausted to the outside of the furnace so that they are removed [reaction formula 2), 3), 4)].

Next, the following description will be made on a sequence (hereinafter, referred to as a second pre-process sequence) for removing contaminants by using a hydrogen gas, a silane gas and a chlorine gas in the second embodiment shown in FIG. 4.

After the pressure inside the furnace is adjusted to a predetermined level (in this case, 45 Pa), the inside of the furnace is exhausted while supplying a hydrogen gas into the furnace, and thus, the inside of the furnace is purged by the hydrogen gas (hydrogen purge step).

Thereafter, while the supply and exhaust of the hydrogen gas into/from the furnace are maintained, the temperature inside the furnace increases from the wafer load temperature to a second pre-process temperature, for example, about 620° C. (temperature increase step).

In the second embodiment, the second pre-process temperature is equal to a film forming temperature which will be described later.

From the temperature increase step, the supply of the silane gas and the chlorine gas into the furnace is started.

That is, in this case, while supplying the hydrogen gas, the silane gas and the chlorine gas into the furnace, the inside of the furnace is exhausted (hydrogen+silane+chlorine purge step).

At this point, the pressure inside the furnace is adjusted to, for example, 50 Pa.

The silane gas and the chlorine gas are continuously supplied for a predetermined time even after the completion of the temperature increase step.

In a state that the supply of the hydrogen gas is maintained, if the supply of the silane gas and the chlorine gas is stopped, the hydrogen purge step is again performed. That is, the supply and exhaust of the hydrogen gas are continuously performed from the hydrogen purge step, which is before the temperature increase step, until completion of the hydrogen purge step, which is after the temperature increase step.

By performing the hydrogen purge step after stopping the supply of the silane gas and the chlorine gas, chlorine remaining on the wafer surface can be removed.

The hydrogen gas, the silane gas and the chlorine gas are supplied from all the nozzles N1 to N5 of FIG. 1 into the furnace. That is, in the hydrogen purge step, the hydrogen gas is supplied from the short nozzle N5, whose gas outlet is positioned in the area corresponding to the manifold 49, and the long nozzles N1 to N4, whose gas outlets are positioned in the areas corresponding to the wafer group array area. In the hydrogen+silane+chlorine purge step, the mixed gas of the hydrogen gas, the silane gas and the chlorine gas is supplied from the short nozzle N5, whose gas outlet is positioned in the area corresponding to the manifold 49, and the long nozzles N1 to N4, whose gas outlets are positioned in the areas corresponding to the wafer group array area. The hydrogen gas, the silane gas and the chlorine gas supplied into the furnace rise up at the inside of the furnace, flow downward through the cylindrical space 47, and are exhausted from the exhaust pipe 53.

By maintaining the supply and exhaust of the hydrogen gas, the silane gas and the chlorine gas for a predetermined time, the process for removing the natural oxide film and the contaminants from the wafer is continued for a predetermined time. A reaction mechanism of the process for removing the natural oxide film and the contaminants will be described below.

First, the mechanism for removing moisture ($H_2O$) and oxygen (O) by the silane gas will be described.

It is considered that the following reaction is performed when the silane gas is supplied into the furnace.

  (5)

  (6)

  (7)

  (8)

  (9)

  (10)

It is considered that at the relatively low temperature within a range of 200-620° C., the silane ($SiH_4$) is not completely decomposed and is separated into $SiH_2$ and $H_2$, or $SiH_3$ and H [reaction formula 5), 6)].

It is considered that they are evaporated in a form of SiO or $H_2O$ by reaction with moisture or oxygen remaining at the atmosphere inside the furnace, and are then exhausted to the outside of the furnace so that they are removed [reaction formula 7), 8), 9)].

However, since the temperature is relatively low, like the reaction formula 10), $SiO_2$ formed on the wafer surface is not removed.

Next, the mechanism for removing oxygen (O) and carbon (C) by chlorine will be described.

It is considered that the following reaction is performed when a chlorine gas is supplied into the furnace.

  (11)

It is considered that there is no direct reaction with O or C by $Cl_2$, but Si is etched by $Cl_2$ [reaction formula 11)]

At this point, it is considered that O or C adsorbed on Si is lift up with Si and thus removed.

Each of the first pre-process sequence and the second pre-process sequence is effective in removing the natural oxide layer and the contaminants from the wafer, and the combination of the two pre-process sequences is also possible.

By combining the two pre-process sequences, it is possible to obtain higher effects in removing the natural oxide film or the contaminants.

After completing the first pre-process sequence or the second pre-process sequence, a film forming step is performed.

The following steps are common to a sequence of a method for forming a silicon layer which is shown in FIG. 3 and FIG. 4.

The heater 42 is controlled by the temperature control unit 51 and, if the temperature inside the furnace is stabilized at the film forming temperature (620° C.) (temperature stabilization step), the supply of the hydrogen gas into the furnace is stopped and the silane gas is supplied into the furnace. In this case, the pressure inside the furnace is adjusted to, for example, 20 Pa. The silane gas is supplied from the short nozzle N5 into the furnace. The silane gas may be supplied from all the nozzles N1 to N5 into the furnace. The silane gas supplied into the furnace rises up at the inside of the furnace, flows downward through the cylindrical space 47, and is exhausted from the exhaust pipe 53.

Since the supplied silane gas is decomposed at a pressure reducing atmosphere heated by the heater 42, the silicon layer is formed on the wafer surface by a thermal CVD reaction (film forming step).

If the wafer surface is cleaned by the first pre-process sequence or the second pre-process sequence, a polycrystalline silicon layer is formed when a base material of the film formation is polycrystalline silicon (poly-Si), and a single-crystalline silicon layer is formed when a base material of the film formation is single-crystalline silicon.

In this way, in accordance with the current embodiment, the single-crystalline silicon layer can be formed at a low temperature of 620° C.

By stopping the supply of the silane gas, the film forming step on the wafer is completed.

After completing the film forming step on the wafer, the pressure inside the furnace is adjusted to a predetermined pressure, for example, a pressure of about 1-10000 Pa. In this case, the pressure inside the furnace is adjusted to 15 Pa.

At the same time when the supply of the silane gas is stopped, the inside of the furnace is purged with the nitrogen gas, so that the inside of the furnace is replaced with the nitrogen gas.

Thereafter, while maintaining the supply of the nitrogen gas into the furnace, the pressure inside the furnace is increased and recovered to the atmospheric pressure (atmospheric pressure recovery step).

After the atmospheric pressure recovery step, the boat 34 holding the processed wafer, that is, the wafer on which the single-crystalline silicon layer or the polycrystalline silicon layer is formed, is moved downward by the boat elevator 24 and is unloaded from the processing chamber 46 (boat unload step).

Until all the wafers 1 held in the boat 34 are cooled, the boat 34 waits in the preparatory chamber 12 (wafer cooling step).

If all the wafers 1 held in the waiting boat 34 are cooled down to a predetermined temperature, the wafers 1 are discharged from the boat 34 by a wafer transfer device (not shown) and charged into a wafer carrier (not shown) (wafer discharge step).

For the next sequence, in parallel to the wafer cooling step, the temperature inside the furnace is decreased from the film forming temperature to a predetermined wafer load temperature, for example, about 300-600° C. (in this case, 200° C.) (temperature decrease step inside the furnace).

From the results obtained by reviewing the examples of the method for forming the silicon layer, the present inventors found the following phenomenon.

In accordance with the current embodiment, in the substrate processing apparatus such as the CVD apparatus 10 where the reaction vessel is formed by the process tube 43 and the manifold 49 installed at the downward of the process tube 43 so that gas flows from the manifold 49 toward the upper area of the process tube 43, contamination degree of oxygen or carbon is greater in the manifold 49, which is lower than the wafer group array area and is at a lower temperature than the wafer group array area, and the area which is upper than the wafer group array area (near the downstream end part of the wafer group array area).

The present inventors considered the reasons for the generation of the above phenomenon as follows.

In the film forming step, the gas supplied from the short nozzle N5 near the manifold 49, which is lower than the wafer group array area and is at a relatively low temperature, rises up at the inside of the processing chamber 46, and a film forming process is performed on the wafer. Thereafter, the gas is exhausted from the exhaust pipe 53 through the cylindrical space 47 formed between the outer tube 44 and the inner tube 45.

If the inside of the furnace is divided into three areas, that is, the upper area of the wafer group array area, the area other than the upper area of the wafer group array area, and the area near the manifold 49, the interface impurity density of oxygen or carbon with respect to the wafer is relatively high at the upper area of the wafer group array area and the area near the manifold 49.

It can be considered that the interface impurity density is relatively high at the area near the manifold 49 because of contamination caused by release of moisture or organic material attached to the manifold 49.

Since moisture or organic material, which is the cause of the interface impurity is easily adsorbed on the surface as the ambient temperature is lower, much more moisture or organic material is adsorbed at the area near the manifold 49, which is at a relatively low temperature inside the furnace, than other areas. It is considered that when the temperature is increased within the film forming sequence, the moisture or organic material is released and then adsorbed on the wafer 1 near the manifold 49.

It can be considered that the interface impurity density is relatively high at the upper area of the wafer group array area because of contamination caused by release of moisture or organic material attached on the wafer 1 or the boat 34.

Due to the structure of the reactor 40, the released moisture or organic material flows through the wafer group array area from downward to upward. Thus, if assuming that the wafers 1 are arranged uniformly in the wafer group array area, it is considered that the upper area of the wafer group array area, which is the downstream side of the wafer group array area, is more influenced from the moisture and organic material released from much more areas than the surfaces of the wafer 1 and the boat 34.

In addition, due to the structure of the reactor 40, it is considered that the influence of counter-diffusion of impurity from the exhaust side is stronger at the upper area of the wafer group array area positioned near the cylindrical space 47.

The present inventors found that the above-described phenomenon could be improved by actively supplying the pre-process gas from the areas where the contamination degree is higher than other areas, that is, (1) The area which is lower than the wafer group array area (the upper side than the wafer group array area), that is, the area corresponding to the manifold which is at a lower temperature than the wafer group array area, (2) The area corresponding to the upper area of the wafer group array area (the downstream end part of the wafer group array area)

Next, the following description will be made on an experiment that was performed for examining the difference of the effects in removing the natural oxide film and contaminants from the wafer (hereinafter, referred to as contamination removal effect) according to the number of supply gas systems.

Figure 5:
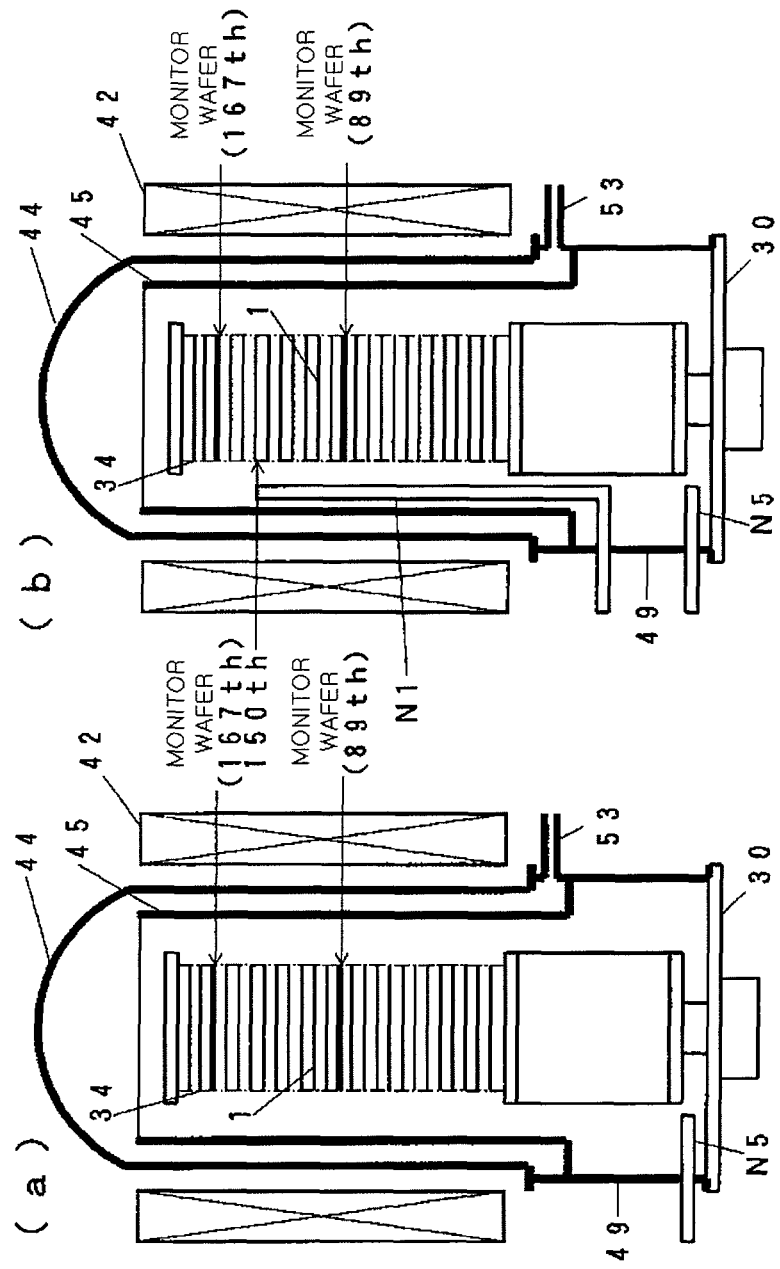
FIG. 5 is a schematic view showing evaluation of a contamination removal effect. Specifically.

FIG. 5 shows an evaluation apparatus used in the experiment.

Like reference numerals refer to like elements in FIG. 1 and FIG. 5, and their description is omitted.

In a first evaluation apparatus shown in FIG. 5A, the first pre-process sequence was performed on the wafer 1 by supplying a hydrogen gas into the furnace through only 1-system of the short nozzle N5, and the film forming step was performed by supplying a silane gas from the short nozzle N5 into the furnace.

The interfacial oxygen and carbon dose, which is an index of the contamination removal effect, was measured with respect to a monitor wafer installed in a center area (89th) and an upper area (167th).

In a second evaluation apparatus shown in FIG. 5B, the first pre-process sequence was performed on the wafer 1 by supplying a hydrogen gas into the furnace through the short nozzle N5 and 2-system of the long nozzle N1, and the film forming step was performed by supplying a silane gas from the short nozzle N5 into the furnace. That is, in the first pre-process sequence, hydrogen was supplied from the area near the manifold 49 by the short nozzle N5, and the hydrogen gas was additionally supplied from a slightly lower area (150th) by the long nozzle N1 in order to improve the interfacial characteristic of the boat upper area (167th) which was relatively more influenced by the contamination caused by degassing from the boat 34 or the wafer 1. Like the experiment using the first evaluation apparatus, monitor wafers were installed in the center area (89th) and the upper area (167th) of the boat 34, and the interfacial oxygen and carbon densities were measured.

Figure 6:
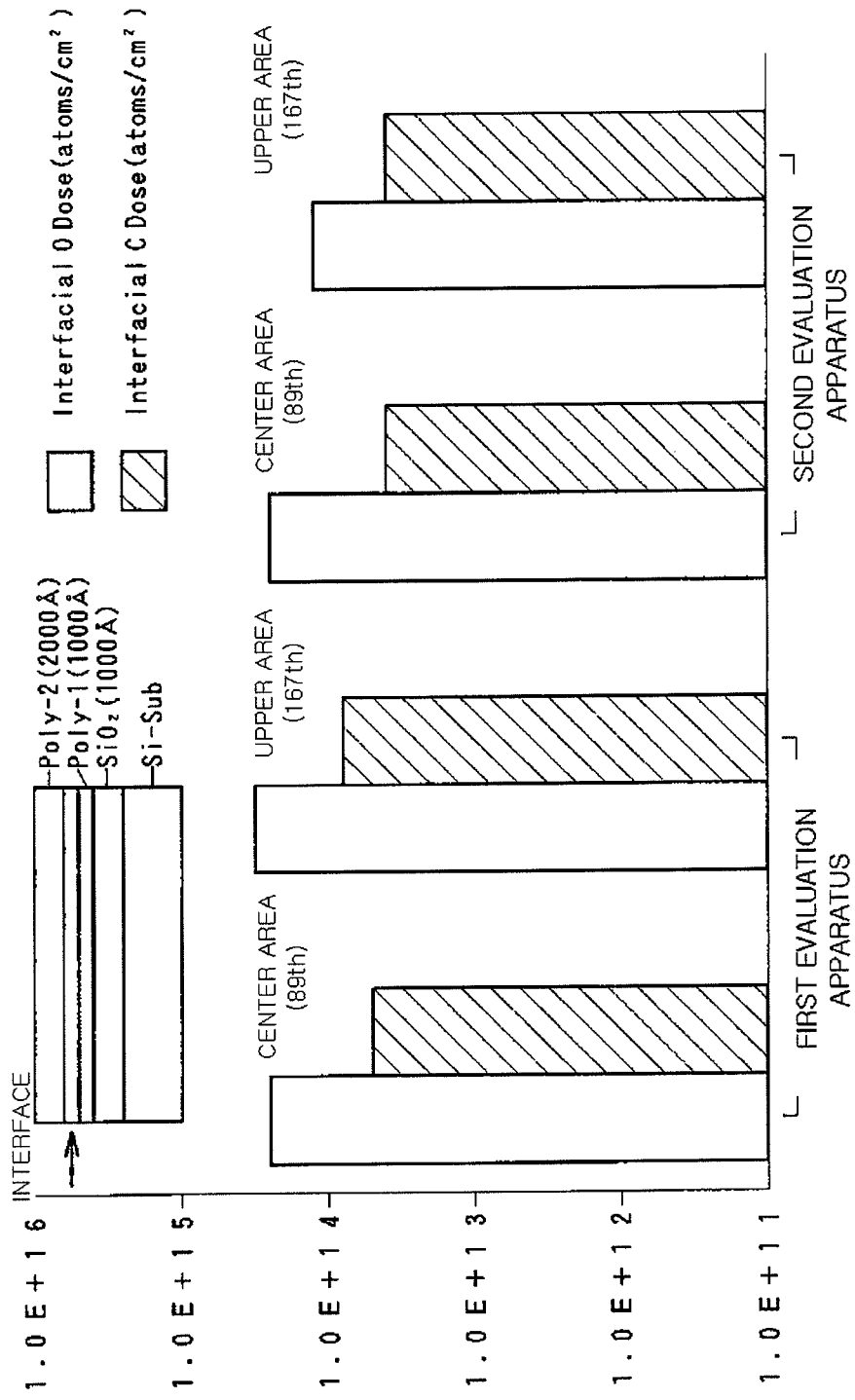
FIG. 6 is a graph showing difference of the contamination removal effect according to the number of supply gas systems.

FIG. 6 is a graph showing the experimental result.

In FIG. 6, a horizontal axis represents the evaluation apparatus, that is, the difference of the number of the supply gas systems, and a vertical axis represents the interfacial oxygen and carbon dose (atoms/cm$^2$).

In this experiment, the hydrogen gas purge temperature of the first pre-process sequence was 800° C., the hydrogen gas purge time was 30 minutes, and the flow rates of the hydrogen gases supplied from the respective nozzles were 5 slm.

In the film forming step, the flow rate of the silane gas was 0.5 slm, the polycrystalline silicon layer of about 200 nm thick was formed on the polycrystalline silicon layer of about 100 nm thick which is the base layer.

The interfacial characteristic was measured with a Secondary Ionization Mass Spectrometer (SIMS).

It can be seen from FIG. 6 that, in the first evaluation apparatus where the number of the hydrogen gas systems is 1-system, the influence of the contamination caused by the degassing from the boat or the wafer is relatively high in the boat upper area.

Comparing the interfacial characteristics of the monitor wafer installed in the boat center area (89th), there is almost no difference between the first evaluation apparatus and the second evaluation apparatus.

Therefore, it can be seen that there are no influences from the increase of the hydrogen gas flow rate when the number of the hydrogen gas systems increases from 1-system to 2-system, the increase of the pressure during the hydrogen gas purge, and the error between the evaluation arrangements.

Meanwhile, if the interfacial characteristic of the monitor wafer installed in the upper area (167th) is compared by the first evaluation apparatus and the second evaluation apparatus, the oxygen dose is reduced by about 61% and the carbon dose is reduced by about 44% by increasing the number of the hydrogen gas systems from 1-system to 2-system and additionally supplying the hydrogen gas at a slightly preceding side (upstream side) of the upper area (167th) with respect to the upper area (167th), thereby greatly reducing the contamination density.

By additionally supplying the pre-process gas such as the hydrogen gas through the multi-system, the contaminants of the wafer surface non-uniformly flowing in a wafer interfacial direction are uniformly removed so that the high-quality interface is uniformly formed in the mass-production process wafer group array area (100-150 sheets).

In the case of FIG. 5B, the gas species, flow rate, and concentration of the pre-process gas as the interface cleaning gas supplied to the long nozzle N1 and the short nozzle N5 were the same.

That is, the gas species of the pre-process gases supplied to the long nozzle N1 and the short nozzle N5 were all the hydrogen gas. In addition, the flow rates of the hydrogen gases supplied to the long nozzle N1 and the short nozzle N5 were all 5 slm. Furthermore, the concentrations of the hydrogen gases supplied to the short nozzle N1 and the short nozzle N5 were all 100%.

However, for example, when the contamination degree inside the processing chamber is non-uniform in the wafer interfacial direction, the gas species or the flow rate and the concentration of the pre-process gas as the interface cleaning gas may be different according to the contamination degree inside the processing chamber as follows.

(1) For example, in the case where the contamination degree in the upper area inside the processing chamber is greater than other areas, the flow rate or the concentration of the pre-process gas supplied from the long nozzle N1 to the upper area inside the processing chamber may be greater than the flow rate or the concentration of the pre-process gas supplied to other areas.

Also, the gas species of the pre-process gas supplied from the long nozzle N1 to the upper area inside the processing chamber may be different from the gas species of the pre-process gas supplied to other areas.

For example, in the case of the device shown in FIG. 5B, the flow rate of the hydrogen gas supplied from the long nozzle N1 to the upper area inside the processing chamber, and the flow rate of the hydrogen gas supplied from the short nozzle N5 to the lower area inside the processing chamber may be 7 slm and 5 slm respectively. The concentration of the hydrogen gas supplied from the long nozzle N1 to the upper area inside the processing chamber, and the concentration of the hydrogen gas supplied from the short nozzle N5 to the lower area inside the processing chamber may be 100% and 80% respectively.

In addition, the pre-process gas supplied from the long nozzle N1 to the upper area inside the processing chamber may be mixed with the hydrogen gas, the silane gas and the chlorine gas, and the pre-process gas supplied from the short nozzle N5 to the lower area inside the processing chamber may be the hydrogen gas.

(2) Also, for example, in the case where the contamination degree in the upper and lower areas inside the processing chamber is greater than other areas, the flow rate or the concentration of the pre-process gas supplied to the upper and lower areas inside the processing chamber may be greater than the flow rate or the concentration of the pre-process gas supplied to other areas.

Furthermore, the gas species of the pre-process gas supplied to the upper and lower areas inside the processing chamber may be different from the gas species of the pre-process gas supplied to other areas.

For example, in the above-described CVD apparatus 10 of FIG. 1 and FIG. 2, the flow rate of the hydrogen gas supplied from the longest long nozzle N1 to the upper area inside the processing chamber, the flow rate of the hydrogen gas supplied from the second longest long nozzle N2 to the central upper area inside the processing chamber, the flow rate of the hydrogen gas supplied from the third longest (second shortest) long nozzle N3 to the central lower area inside the processing chamber, the flow rate of the hydrogen gas supplied from the shortest long nozzle N4 to the lower area inside the processing chamber, and the flow rate of the hydrogen gas supplied from the short nozzle N5 below the processing chamber may be 8 slm, 6 slm, 5 slm, 6 slm and 7 slm respectively.

In addition, the concentration of the hydrogen gas supplied from the longest long nozzle N1 to the upper area inside the processing chamber, the concentration of the hydrogen gas supplied from the second longest long nozzle N2 to the central upper area inside the processing chamber, the concentration of the hydrogen gas supplied from the third longest (second shortest) long nozzle N3 to the central lower area inside the processing chamber, the concentration of the hydrogen gas supplied from the shortest long nozzle N4 to the lower area inside the processing chamber, and the concentration of the hydrogen gas supplied from the short nozzle N5 below the processing chamber may be 100%, 80%, 80%, 90% and 100% respectively.

Furthermore, the pre-process gas supplied from the longest long nozzle N1 to the upper area inside the processing chamber may be the mixed gas of the hydrogen gas, the silane gas and the chlorine gas; the pre-process gas supplied from the second longest long nozzle N2 to the central upper area inside the processing chamber, the pre-process gas supplied from the third longest (second shortest) long nozzle N3 to the central lower area inside the processing chamber, and the pre-process gas supplied from the shortest long nozzle N4 to the lower area inside the processing chamber may be the hydrogen gas; and the pre-process gas supplied from the short nozzle N5 below the processing chamber may be the mixed gas of the hydrogen gas, the silane gas and the chlorine gas.

That is, in the pre-process procedure, the pre-process gas is supplied from a plurality of positions inside the processing chamber, and the flow rate, concentration or kinds of the pre-process gas may be different in at least one of the positions and the other positions.

In this way, the flow rate, concentration or kinds of the pre-process gas at the respective positions are different according to the contamination degrees of the respective positions inside the processing chamber, and thus, the natural oxide film or impurity on the wafer is removed effectively and uniformly over the wafer interfacial direction, so that the high-quality interface is uniformly formed at the low oxygen and carbon dose in the mass-production process which batch-processes 100-150 sheets.

(3) Moreover, for example, as the case where the contamination degree at the upper and lower areas inside the processing chamber is greater than other areas, if the pre-process gas supplied from the upper and lower areas inside the processing chamber is the mixed gas of a plurality of kinds of the pre-process gases, and the pre-process gas supplied to the other areas inside the processing chamber is the same mixed gas, the flow rate ratio or concentration ratio of the plurality of kinds of the pre-process gases supplied from the upper and lower areas inside the processing chamber may be different the flow rate ratio or concentration ratio of the plurality of kinds of the pre-process gases supplied from the other areas.

For example, in the above-described CVD apparatus 10, when the mixed gas of the hydrogen gas, the silane gas and the chlorine gas is supplied as the pre-process gas from the respective nozzles, the flow rate ratio of the hydrogen gas, the silane gas and the chlorine gas supplied from the long nozzle N1 to the upper area inside the processing chamber, the flow rate ratio of the hydrogen gas, the silane gas and the chlorine gas supplied from the long nozzles N2, N3 and N4 to the central upper area, the central lower area, and the lower area inside the processing chamber, and the flow rate ratio of the hydrogen gas, the silane gas and the chlorine gas supplied from the short nozzle N5 below the processing chamber may be 5:3:2, 8:1:1 and 6:3:1 respectively.

That is, in the pre-process procedure, the plurality of kinds of the pre-process gases are supplied from a plurality of positions inside the processing chamber, and the flow rate ratio or concentration ratio of the plurality of kinds of the pre-process gases may be different in at least one of the positions and the other positions.

In this way, the flow rate ratios or concentration ratios of the plurality of kinds of the pre-process gases at the respective positions are different according to the contamination degrees of the respective positions inside the processing chamber, and thus, the natural oxide film or impurity on the wafer is removed effectively and uniformly over the wafer interfacial direction, so that the high-quality interface is uniformly formed at the low oxygen and carbon dose in the mass-production process which batch-processes 100-150 sheets.

It is preferable that the plurality of positions supplying the pre-process gases inside the processing chamber include at least one position in the upper area than the wafer group array area, and at least one position in the area corresponding to the wafer group array area.

It is more preferable that the pre-process gases are supplied from at least one position in the area corresponding to the manifold, and at least one position in the upper area of the area corresponding to the wafer group array area.

That is, it is more preferable that the pre-process gases are supplied from at least one position in the area that is at a lower temperature than the wafer group array area, and at least one position in the downstream end part of the area corresponding to the wafer group array area.

It is more preferable that the pre-process gases are supplied from at least one position in the area that is lower than the wafer group array area, and at least one position in the upper area of the area corresponding to the wafer group array area.

Moreover, it is preferable that the pre-process gas nozzles supplying the pre-process gases, and the main-process gas nozzles supplying the film forming gas as the main-process gas are the same.

Next, as the case where the contamination degree at the lower area inside the processing chamber is high, the following description will be made on an experiment that was performed for examining the difference of the interfacial contamination (interfacial oxygen dose) when changing the flow rate ratio of the chlorine gas and the hydrogen gas supplied as the pre-process gases from the short nozzle N5 to the lower area inside the processing chamber.

The experiment was performed by using the first evaluation apparatus of FIG. 5A.

That is, the first evaluation apparatus of FIG. 5A was used, and the pre-process was performed on the wafer by supplying the mixed gas of the chlorine gas and the hydrogen gas as the pre-process gas into the furnace. Then, D-poly Si layer of 10 nm was formed on the wafer.

In the pre-process, the flow rate ratio of the chlorine gas and the hydrogen gas was changed into two cases: chlorine/hydrogen=0.02 and chlorine/hydrogen=0.1.

The measurement of the interfacial contaminant (interfacial oxygen dose) was performed by installing the monitor wafer in the lower area (11th) of the boat.

Figure 7:
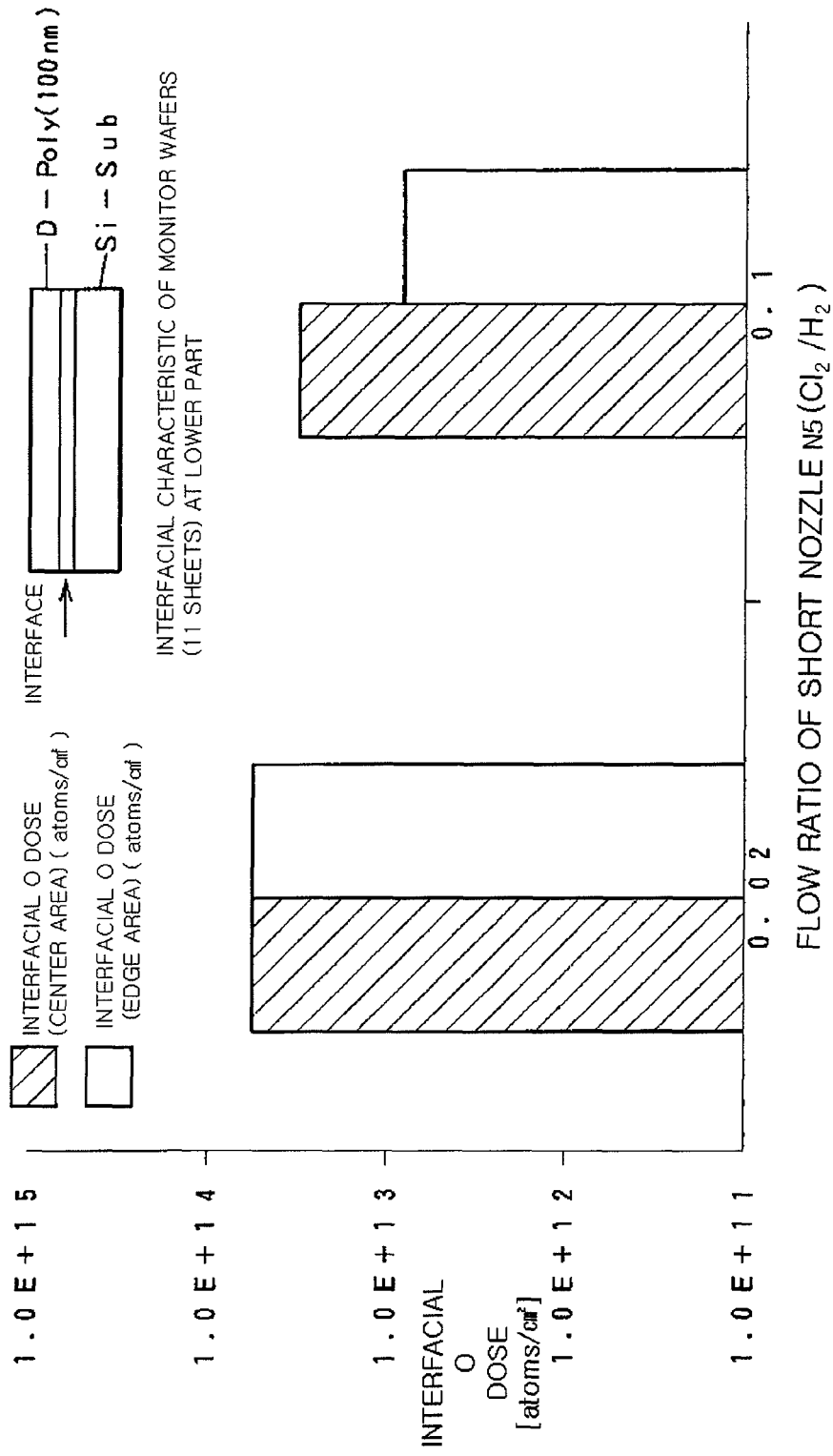
FIG. 7 is a graph showing difference of the interfacial oxygen dose when flow rate ratio of a chlorine gas to a hydrogen gas are changed.

The difference of the interfacial oxygen dose according to the flow rate ratio of the chlorine gas and the hydrogen gas is shown in FIG. 7.

In FIG. 7, a horizontal axis represents a flow rate ratio (chlorine/hydrogen) of the chlorine gas and the hydrogen gas, and a vertical axis represents an interfacial oxygen dose (atoms/cm$^2$).

The interfacial characteristic was measured with an SIMS.

The following facts are known from FIG. 7.

In the pre-process, the interfacial oxygen dose is lower in the case of chlorine/hydrogen=0.1 than the case of chlorine/hydrogen=0.02.

That is, when the ratio of the chlorine gas to the hydrogen gas (chlorine/hydrogen) is increased, the high-quality interface can be obtained at the low oxygen does. It is considered that this is because as the ratio of the chlorine gas increases, the etching of the wafer is accelerated so that the contamination removal effect is increased.

Regarding the explanation of the second pre-process sequence, as described above, in the case of using the chlorine gas, the interfacial contaminants can be removed by etching the silicon wafer by using the reaction of $Cl_2$ and Si as expressed in the reaction formula 11).

In this case, in order to make the uniform film thickness distribution in the wafer interfacial direction after the pre-process, the silicon etching amount needs to be uniform in the wafer interfacial direction.

For example, in the above-described CVD apparatus 10, in the case where the silicon etching degree at the upper area inside the processing chamber is higher than other areas, the flow rate or concentration of the pre-process gas supplied from the long nozzle N1 to the upper area inside the processing chamber may be smaller than the flow rate or concentration of the pre-process gas supplied to other areas, or the gas species of the pre-process gas supplied from the long nozzle N1 to the upper area inside the processing chamber may be different from the gas species supplied to other areas.

Next, as the case where the contamination degree at the lower area inside the processing chamber is high, the following description will be made on an experiment that was performed for examining the difference of the silicon etching amount when changing the flow rate ratio of the chlorine gas and the hydrogen gas and the flow rate ratio of the silane gas and the chlorine gas supplied from the short nozzle N5 to the lower area inside the processing chamber.

The experiment was performed by using the first evaluation apparatus of FIG. 5A.

That is, the first evaluation apparatus of FIG. 5A was used, and the pre-process was performed on the wafer by supplying the mixed gas of the hydrogen gas, the silane gas and the chlorine gas as the pre-process gas into the furnace.

In the pre-process, the flow rate ratio of the chlorine gas and the hydrogen gas was changed into two cases: chlorine/hydrogen=0.02 and chlorine/hydrogen=0.1, and the flow rate ratio of the silane gas and the chlorine gas was changed into two cases: silane/chlorine=0 and silane/chlorine=2.5.

The measurement of the silicon etching amount was performed by installing the monitor wafers in the upper area (167th), the center area (89th) and the lower area (11th) of the boat.

Figure 8:
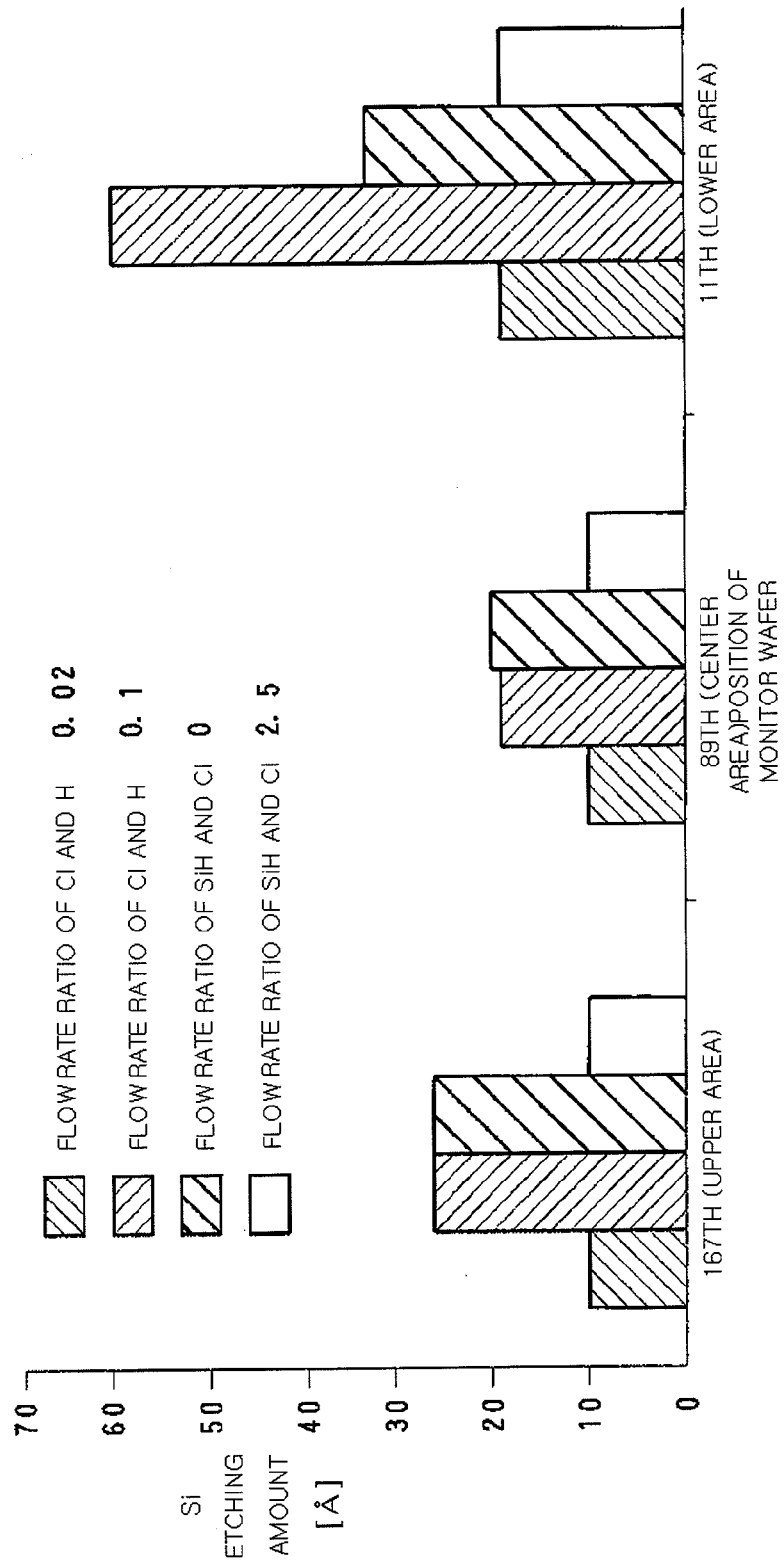
FIG. 8 is a graph showing difference of the silicon etching amount according to a flow rate ratio of a chlorine gas to a hydrogen gas and a flow rate ratio of a silane gas to a chlorine gas.

The difference of the silicon etching amount according to the flow rate ratio of the chlorine gas and the hydrogen gas and the flow rate ratio of the silane gas and the chlorine gas at each position of the monitor wafers is shown in FIG. 8.

In FIG. 8, a horizontal axis represents the position of the monitor wafer, and a vertical axis represents a silicon etching amount (Å).

The following facts are known from FIG. 8.

In the pre-process, the silicon etching amount distribution in the wafer interfacial direction becomes more uniform in the case of chlorine/hydrogen=0.02 than the case of chlorine/hydrogen=0.1.

That is, when the ratio of the chlorine gas to the hydrogen gas is reduced, the silicon etching amount distribution in the wafer interfacial direction can be uniform.

Also, in the pre-process, the silicon etching amount distribution in the wafer interfacial direction becomes more uniform in the case of silane/chlorine=0 than the case of silane/chlorine=2.5, so that the silicon etching amount is increased as a whole.

That is, when the ratio of the silane gas to the chlorine gas is reduced, the silicon etching amount can be increased in all areas while maintaining the excellent silicon etching amount distribution in the wafer interfacial direction.

From the above fact, if the ratio of the chlorine gas to the hydrogen gas is reduced in order to make the uniform silicon etching amount distribution in the wafer interfacial direction, the silicon etching amount is reduced in all areas and thus the interfacial impurity removal effect may be lowered.

In this case, since the silicon etching amount can be increased in all areas by reducing the ratio of the silane gas to the chlorine gas, the contamination removal effect is increased in all areas while maintaining the excellent silicon etching amount.

In the case where the silicon etching degree at the upper and low areas inside the processing chamber is greater than other areas, the flow rate or concentration of the pre-process gas supplied to the upper and lower areas inside the processing chamber may be set to be less than the flow rate or concentration of the pre-process gas supplied to other areas, or the gas species of the pre-process gas supplied to the upper and lower areas inside the processing chamber may be different from the gas species of the pre-process gas supplied to other areas. In this way, the silicon etching degree in the wafer interfacial direction may be made uniform.

For example, the above-described CVD apparatus 10 may set the parameters as follows.

(1) The flow rate of the chlorine gas supplied from the long nozzle N1 to the upper area inside the processing chamber, the flow rate of the chlorine gas supplied from the long nozzle N2 to the central upper area inside the processing chamber, the flow rate of the chlorine gas supplied from the long nozzle N3 to the central lower area inside the processing chamber, the flow rate of the chlorine gas supplied from the long nozzle N4 to the lower area inside the processing chamber, and the flow rate of the chlorine gas supplied from the short nozzle N5 below the processing chamber are 50 sccm, 40 sccm, 30 sccm, 40 sccm and 60 sccm respectively.

(2) The concentration of the chlorine gas supplied from the long nozzle N1 to the upper area inside the processing chamber, the concentration of the chlorine gas supplied from the long nozzle N2 to the central upper area inside the processing chamber, the concentration of the chlorine gas supplied from the long nozzle N3 to the central lower area inside the processing chamber, the concentration of the chlorine gas supplied from the long nozzle N4 to the lower area inside the processing chamber, and the concentration of the chlorine gas supplied from the short nozzle N5 below the processing chamber are 20%, 10%, 5%, 10% and 30% respectively.

(3) The pre-process gas supplied from the long nozzle N1 to the upper area inside the processing chamber is the mixed gas of the hydrogen gas and the chlorine gas; the pre-process gas supplied from the long nozzle N2 to the central upper area inside the processing chamber, the pre-process gas supplied from the long nozzle N3 to the central lower area inside the processing chamber, and the pre-process gas supplied from the long nozzle N4 to the lower area inside the processing chamber are the mixed gas of the hydrogen gas, the silane gas and the chlorine gas; and the pre-process gas supplied from the short nozzle N5 below the processing chamber is the mixed gas of the hydrogen gas and the chlorine gas.

By changing the flow rate, concentration or kinds of the pre-process gases at the respective nozzles according to the silicon etching amount, the silicon etching degree in the wafer interfacial direction can be made uniform, and thus, the film thickness distribution in the wafer interfacial direction after the pre-process can be made uniform.

It is apparatus that the present invention is not limited to the aforementioned embodiments, and various modifications may be made without departing from the spirit and scope of the invention.

Since the gas outlets as the long nozzles are formed at the front ends of the nozzles, it is possible to use the nozzles that are opened so that the gases are sprayed upwards. Furthermore, since the plurality of gas outlets as shown in FIG. 9 are formed at the nozzle pipe walls, it is possible to use the nozzles that are opened so that the gases are sprayed in a horizontal direction.

Figure 9:
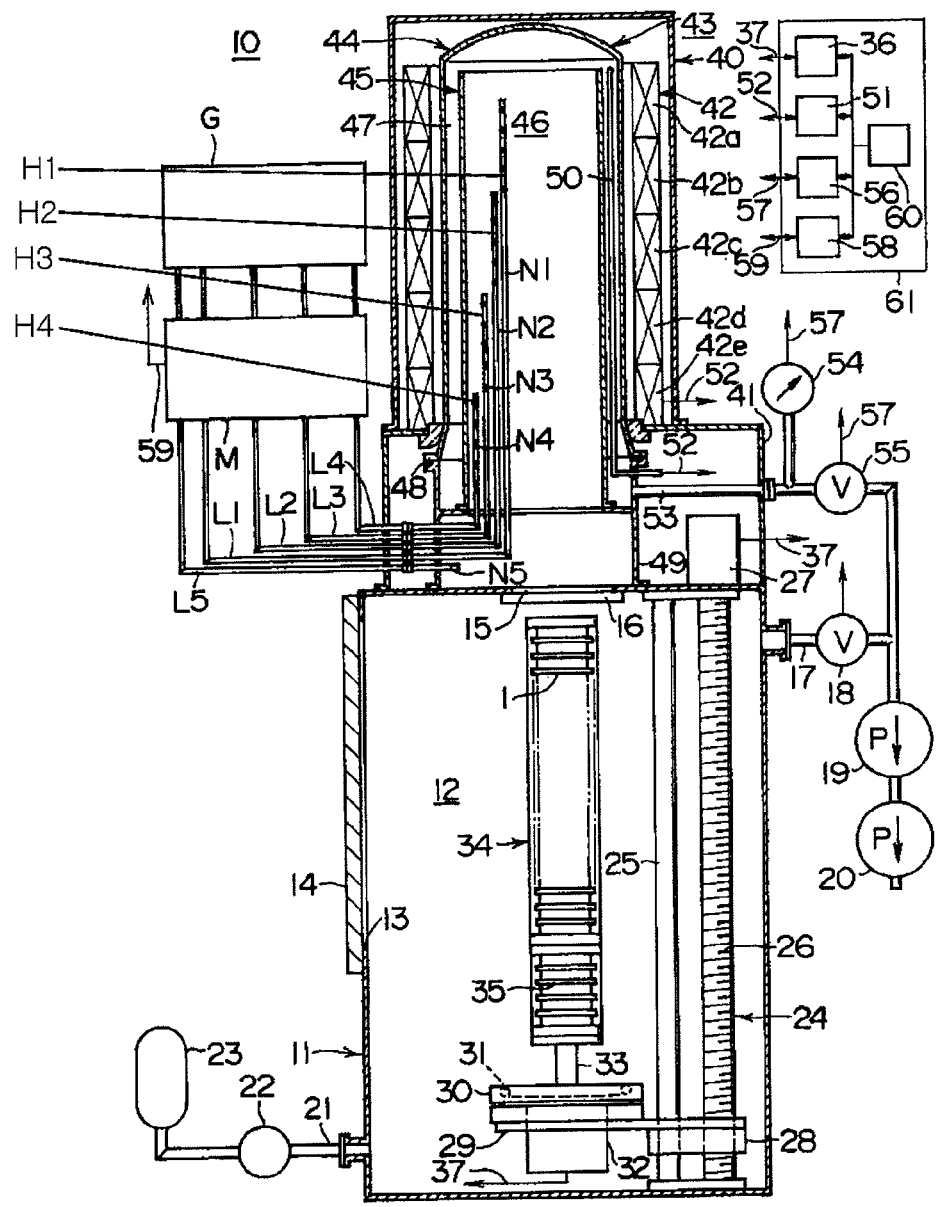
FIG. 9 is a side sectional view schematically showing a CVD apparatus in accordance with a second embodiment of the present invention.

In this case, it is preferable that the gas spray holes H1 to H4 installed in the long nozzles N1 to N4 are installed at positions that are not overlapped in a vertical direction as shown in FIG. 9. FIG. 9 shows an example where five gas outlets are installed at the front end parts of the long nozzles at regular intervals, and the gas spray holes H1 to H4 of the long nozzles N1 to N4 are installed at regular intervals so that the gas outlets of the entire long nozzles are installed at regular intervals. By arranging the gas spray holes H1 to H4 of the long nozzles N1 to N4 in the above manner, the pre-process gas can be supplied uniformly over the inside of the furnace.

The size (diameter), hole number, and pitch of the gas spray holes H1 to H4 may be different according to positions.

Although the case of forming the polycrystalline silicon layer or the single-crystalline silicon layer on the wafer has been described in the above embodiment, the present invention is not limited thereto, but can also be applied to the formation of an amorphous film, a doped single-crystalline film, a polycrystalline film, an amorphous film, a nitride film, an oxide film, or a metal film.

Although the CVD apparatus has been described in the above embodiment, the present invention is not limited thereto, but can also be applied to a substrate processing apparatus.

In particular, the excellent effect can be obtained when the present invention is applied to the case where the high-quality interface needs to be formed between the substrate and the thin film.

According to the present invention, in the mass-production batch process, the natural oxide film or impurity on the substrate can be removed effectively and uniformly over the substrate interfacial direction, and thus, the high-quality interface can be formed uniformly over the substrate interfacial direction at the low carbon and carbon dose.

(Supplementary Note)

The present invention includes the following embodiments.

(Supplementary Note 1)

According to an embodiment of the present invention, there is provided a manufacturing method of a semiconductor device, comprising: loading a plurality of substrates into a reaction vessel, which is configured by a process tube and a manifold that supports the process tube, and arranging the loaded substrates within the reaction vessel; pre-processing the plurality of substrates by supplying a pre-process gas from the manifold side toward the process tube side within the reaction vessel; main-processing the plurality of pre-processed substrates by supplying a main-process gas from the manifold side toward the process tube side within the reaction vessel; and unloading the plurality of main-processed substrates from the reaction vessel, wherein in pre-processing the plurality of substrates, the pre-process gas is supplied from at least one position in an area corresponding to the manifold, and at least one position in an upper area of an area corresponding to a substrate arrangement area.

(Supplementary Note 2)

According another embodiment of the present invention, there is provided a manufacturing method of a semiconductor device, comprising: loading a plurality of substrates into a reaction vessel, and arranging the loaded substrates within the reaction vessel; pre-processing the plurality of substrates by supplying a pre-process gas into the reaction vessel; main-processing the plurality of pre-processed substrates by supplying a main-process gas into the reaction vessel; and unloading the plurality of main-processed substrates from the reaction vessel, wherein in pre-processing the plurality of substrates, the pre-process gas is supplied from at least one position in an area which is at a lower temperature than temperature in a substrate arrangement area, and at least one position in a downstream end area of an area corresponding to the substrate arrangement area.

(Supplementary Note 3)

According another embodiment of the present invention, there is provided a manufacturing method of a semiconductor device, comprising: loading a plurality of substrates into a reaction vessel, and arranging the loaded substrates within the reaction vessel; pre-processing the plurality of substrates by supplying a pre-process gas into the reaction vessel; main-processing the plurality of preprocessed substrates by supplying a main-process gas into the reaction vessel; and unloading the plurality of main-processed substrates from the reaction vessel, wherein in pre-processing the plurality of substrates, the pre-process gas is supplied from at least one position in an area which is lower than a substrate arrangement area, and at least one position in an upper area of an area corresponding to the substrate arrangement area.

(Supplementary Note 4)

According another embodiment of the present invention, there is provided a manufacturing method of a semiconductor device, comprising: loading a substrate into a reaction vessel; pre-processing the substrate inside the reaction vessel; main-processing the pre-processed substrate inside the reaction vessel; and unloading the main-processed substrate from the reaction vessel, wherein in pre-processing the substrate, the pre-process gas is supplied from a plurality of positions inside the reaction vessel, and flow rates, concentrations or kinds of the pre-process gas are different in at least one position of the plurality of positions and the other positions.

(Supplementary Note 5)

According another embodiment of the present invention, there is provided a manufacturing method of a semiconductor device, comprising: loading a substrate into a reaction vessel; preprocessing the substrate inside the reaction vessel; main-processing the pre-processed substrate inside the reaction vessel; and unloading the main-processed substrate from the reaction vessel, wherein in pre-processing the substrate, a plurality of kinds of the pre-process gas are supplied from a plurality of positions inside the reaction vessel, and flow rate ratios or concentration ratios of the plurality of kinds of the pre-process gas are different in at least one position of the plurality of positions and the other positions.

(Supplementary Note 6)

According another embodiment of the present invention, there is provided a substrate processing apparatus, comprising: a process tube for processing a plurality of substrates; a manifold for supporting the process tube; a support member for arranging and supporting the plurality of substrates inside the process tube; a first nozzle for supplying a gas from at least one position in an area corresponding to the manifold; a second nozzle for supplying a gas from at least one position of an upper area of an area corresponding to a substrate arrangement area inside the process tube; an exhaust passage, installed at an opposite side to a side where the first nozzle is installed in the process tube, for exhausting the inside of the process tube; and a controller for executing a control so as to pre-process the plurality of substrates by supplying a pre-process gas from the first nozzle and the second nozzle toward the exhaust passage, and main-process the plurality of pre-processed substrates by supplying a main-process gas from at least the first nozzle toward the exhaust passage.

(Supplementary Note 7)

In the substrate processing apparatus of Supplementary Note 6, it is preferable that the controller executes a control so that flow rates, concentrations or kinds of the pre-process gas are different in the first nozzle and the second nozzle when the pre-process gas is supplied from the first nozzle and the second nozzle.

(Supplementary Note 8)

According another embodiment of the present invention, there is provided a substrate processing apparatus, comprising: a process tube for processing a plurality of substrates; a manifold for supporting the process tube; a support member for arranging and supporting the plurality of substrates inside the process tube; a first nozzle for supplying a gas from at least one position in an area corresponding to the manifold; a second nozzle for supplying a gas from a plurality of positions including at least an upper area of an area corresponding to a substrate arrangement area inside the process tube; an exhaust passage, installed at an opposite side to a side where the first nozzle is installed in the process tube, for exhausting the inside of the process tube; and a controller for executing a control so as to pre-process the plurality of substrates by supplying a pre-process gas from the first nozzle and the second nozzle toward the exhaust passage, and main-process the plurality of pre-processed substrates by supplying a main-process gas from at least the first nozzle toward the exhaust passage.

(Supplementary Note 9)

In the substrate processing apparatus of Supplementary Note 8, it is preferable that the controller executes a control so that flow rates, concentrations or kinds of the pre-process gas are different in at least one position and the other positions among gas supply positions of the first nozzle and the second nozzle when the pre-process gas is supplied from the first nozzle and the second nozzle.

What is claimed is:

1. A manufacturing method of a semiconductor device, comprising steps of:
   (a) loading a plurality of substrates into a reaction vessel including a process tube and a manifold that supports the process tube, and arranging the plurality of substrates loaded in the reaction vessel;
   (b) carrying out a pre-process by supplying a pre-process gas from a manifold side toward a process tube side within the reaction vessel to remove a natural oxide film or a contaminant from the plurality of substrates;
   (c) carrying out a main-process by supplying a main-process gas from the manifold side toward the process tube side within the reaction vessel to form a thin film on the plurality of substrates subjected to the pre-process; and
   (d) unloading the plurality of substrates subjected to the main-process from the reaction vessel,
   wherein, in the step (b), mixtures of a hydrogen-containing gas, a silicon-containing gas and a chlorine-containing gas are supplied as the pre-process gas from at least one position in an area of an inside of the reaction vessel corresponding to the manifold, and from at least one position in an upper area of an area located between the process tube and the plurality of substrates and corresponding to a substrate arrangement area, and flow rate ratios or concentration ratios of the mixtures are different in at least one position and the other positions among positions from which the pre-process gas is supplied.

2. A manufacturing method of a semiconductor device, comprising steps of:
   (a) loading a plurality of substrates into a reaction vessel, and arranging the plurality of substrates loaded in the reaction vessel;
   (b) carrying out a pre-process by supplying a pre-process gas into the reaction vessel to remove a natural oxide film or a contaminant from the plurality of substrates;
   (c) carrying out a main-process by supplying a main-process gas into the reaction vessel to form a thin film on the plurality of substrates subjected to the pre-process; and
   (d) unloading the plurality of substrates subjected to the main-process from the reaction vessel,
   wherein, in the step (b), mixtures of a hydrogen-containing gas, a silicon-containing gas and a chlorine-containing gas are supplied as the pre-process gas from at least one position in an area having a temperature lower than that of a substrate arrangement area in the reaction vessel, and from at least one position in a downstream end area of an area located between the reaction vessel and the plurality of substrates and corresponding to the substrate arrangement area, and flow rate ratios or concentration ratios of the mixtures are different in at least one position and the other positions among positions from which the pre-process gas is supplied.

3. A manufacturing method of a semiconductor device, comprising steps of:
   (a) loading a plurality of substrates into a reaction vessel, and arranging the plurality of substrates loaded in the reaction vessel;
   (b) carrying out a pre-process by supplying a pre-process gas into the reaction vessel to remove a natural oxide film or a contaminant from the plurality of substrates;
   (c) carrying out a main-process by supplying a main-process gas into the reaction vessel to form a thin film on the plurality of substrates subjected to the pre-process; and
   (d) unloading the plurality of substrates subjected to the main-process from the reaction vessel,
   wherein, in the step (b), mixtures of a hydrogen-containing gas, a silicon-containing gas and a chlorine-containing gas are supplied as the pre-process gas from at least one position in an area lower than a substrate arrangement area in the reaction vessel, and from at least one position in an upper area of an area located between the reaction vessel and the plurality of substrates and corresponding to the substrate arrangement area, and flow rate ratios or concentration ratios of the mixtures are different in at least one position and the other positions among positions from which the pre-process gas is supplied.

4. A manufacturing method of a semiconductor device, comprising steps of:
   (a) loading a plurality of substrates into a reaction vessel, and arranging the plurality of substrates loaded in the reaction vessel;
   (b) carrying out a pre-process by supplying a pre-process gas into the reaction vessel to remove a natural oxide film or a contaminant from the plurality of substrates;
   (c) carrying out a main-process by supplying a main-process gas into the reaction vessel to form a thin film on the plurality of substrates subjected to the pre-process; and
   (d) unloading the plurality of substrates subjected to the main-process from the reaction vessel,
   wherein, in the step (b), mixtures of a hydrogen-containing gas, a silicon-containing gas and a chlorine-containing gas are supplied as the pre-process gas from at least one position in an area having a temperature lower than that of a substrate arrangement area in the reaction vessel, and from at least one position in a downstream end area of an area located between the reaction vessel and the plurality of substrates and corresponding to the substrate arrangement area, and flow rate ratios or concentration ratios of the mixtures are different in at least one position and the other positions among positions from which the pre-process gas is supplied, and types of the pre-process gas are different in at least one position and the other positions among positions from which the pre-process gas is supplied.

5. A manufacturing method of a semiconductor device, comprising steps of:
   (a) loading a plurality of substrates into a reaction vessel, and arranging the plurality of substrates loaded in the reaction vessel;
   (b) carrying out a pre-process by supplying a pre-process gas into the reaction vessel to remove a natural oxide film or a contaminant from the plurality of substrates;
   (c) carrying out a main-process by supplying a main-process gas into the reaction vessel to form a thin film on the plurality of substrates subjected to the pre-process; and
   (d) unloading the plurality of substrates subjected to the main-process from the reaction vessel,
   wherein, in the step (b), mixtures of a hydrogen-containing gas, a silicon-containing gas and a chlorine-containing gas are supplied as the pre-process gas from at least one position in an area lower than a substrate arrangement area in the reaction vessel, and from at least one position in an upper area of an area located between the reaction vessel and the plurality of substrates and corresponding to the substrate arrangement area, and flow rate ratios or concentration ratios of the mixtures are different in at least one position and the other positions among positions from which the pre-process gas is supplied, and types of the pre-process gas are different in at least one position and the other positions among positions from which the pre-process gas is supplied.

6. A manufacturing method of a semiconductor device, comprising steps of:
(a) loading a plurality of substrates into a reaction vessel including a process tube and a manifold that supports the process tube, and arranging the plurality of substrates loaded in the reaction vessel;
(b) carrying out a pre-process by supplying a pre-process gas from a manifold side toward a process tube side within the reaction vessel to remove a natural oxide film or a contaminant from the plurality of substrates;
(c) carrying out a main-process by supplying a main-process gas from the manifold side toward the process tube side within the reaction vessel to form a thin film on the plurality of substrates subjected to the pre-process; and
(d) unloading the plurality of substrates subjected to the main-process from the reaction vessel,
wherein, in the step (b), mixtures of a hydrogen-containing gas, a silicon-containing gas and a chlorine-containing gas are supplied as the pre-process gas from at least one position in an area of an inside of the reaction vessel corresponding to the manifold, and from a plurality of positions in an area located between the process tube and the plurality of substrates and corresponding to a substrate arrangement area, and flow rate ratios or concentration ratios of the mixtures are different in at least one position and the other positions among positions from which the pre-process gas is supplied.

7. The manufacturing method of claim 6, wherein the plurality of positions comprises at least one position in an upper area of the area located between the process tube and the plurality of substrates and corresponding to the substrate arrangement area.

8. A manufacturing method of a semiconductor device, comprising steps of:
(a) loading a plurality of substrates into a reaction vessel, and arranging the plurality of substrates loaded in the reaction vessel;
(b) carrying out a pre-process by supplying a pre-process gas into the reaction vessel to remove a natural oxide film or a contaminant from the plurality of substrates;
(c) carrying out a main-process by supplying a main-process gas into the reaction vessel to form a thin film on the plurality of substrates subjected to the pre-process; and
(d) unloading the plurality of substrates subjected to the main-process from the reaction vessel,
wherein, in the step (b), mixtures of a hydrogen-containing gas, a silicon-containing gas and a chlorine-containing gas are supplied as the pre-process gas from at least one position in an area having a temperature lower than that of a substrate arrangement area in the reaction vessel, and from a plurality of positions in an area located between the reaction vessel and the plurality of substrates and corresponding to the substrate arrangement area, and flow rate ratios or concentration ratios of the mixtures are different in at least one position and the other positions among positions from which the pre-process gas is supplied.

9. The manufacturing method of claim 8, wherein the plurality of positions comprises at least one position in a downstream end area of the area located between the reaction vessel and the plurality of substrates and corresponding to the substrate arrangement area.

10. A manufacturing method of a semiconductor device, comprising:
(a) loading a plurality of substrates into a reaction vessel, and arranging the plurality of substrates loaded in the reaction vessel;
(b) carrying out a pre-process by supplying a pre-process gas into the reaction vessel to remove a natural oxide film or a contaminant from the plurality of substrates;
(c) carrying out a main-process by supplying a main-process gas into the reaction vessel to form a thin film on the plurality of substrates subjected to the pre-process; and
(d) unloading the plurality of substrates subjected to the main-process from the reaction vessel,
wherein, in the step (b), mixtures of a hydrogen-containing gas, a silicon-containing gas and a chlorine-containing gas are supplied as the pre-process gas from at least one position in an area lower than a substrate arrangement area in the reaction vessel, and from a plurality of positions in an area located between the reaction vessel and the plurality of substrates and corresponding to the substrate arrangement area and flow rate ratios or concentration ratios of the mixtures are different in at least one position and the other positions among positions from which the pre-process gas is supplied.

11. The manufacturing method of claim 10, wherein the plurality of positions comprises at least one position in an upper area of the area located between the reaction vessel and the plurality of substrates and corresponding to the substrate arrangement area.

* * * * *